US012614019B2

(12) United States Patent　　(10) Patent No.:　US 12,614,019 B2
Milton et al.　　(45) Date of Patent:　Apr. 28, 2026

(54) METHODS OF DETERMINING AN EFFECT OF ELECTRONIC COMPONENT PLACEMENT ACCURACY ON WIRE LOOPS IN A SEMICONDUCTOR PACKAGE, AND RELATED METHODS

(71) Applicant: Kulicke and Soffa Industries, Inc., Fort Washington, PA (US)

(72) Inventors: Basil Milton, Fort Washington, PA (US); Wei Qin, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 661 days.

(21) Appl. No.: 18/121,100

(22) Filed: Mar. 14, 2023

(65) Prior Publication Data

US 2023/0325578 A1　　Oct. 12, 2023

Related U.S. Application Data

(60) Provisional application No. 63/330,133, filed on Apr. 12, 2022.

(51) Int. Cl.
G06F 30/398　　(2020.01)
(52) U.S. Cl.
CPC .................................. G06F 30/398 (2020.01)
(58) Field of Classification Search
USPC ......................................................... 716/132
See application file for complete search history.

(56) References Cited

U.S. PATENT DOCUMENTS 9,349,676 B2　　5/2016　Usui
2019/0102498 A1*　4/2019　Flowers ................ G06F 30/367
2019/0279959 A1　　9/2019　Hiemstra
2020/0251444 A1　　8/2020　Milton et al.

FOREIGN PATENT DOCUMENTS

CN　　　110660689　　　1/2020
JP　　　2008-016632　　　1/2008

OTHER PUBLICATIONS

International Search Report dated Jul. 4, 2023 for International Patent Application No. PCT/US2023/015157.

* cited by examiner

*Primary Examiner* — Bryce M Aisaka
(74) *Attorney, Agent, or Firm* — Christopher M. Spletzer, Sr.

(57) ABSTRACT

A method of determining an effect of electronic component placement accuracy on wire loops in a semiconductor package is provided. The method includes the steps of: (a) providing package data for a semiconductor package, the semiconductor package including an electronic component; (b) simulating placement of the electronic component in a plurality of positions with respect to a substrate in the semiconductor package; and (c) determining, using a software tool, an effect of each of the plurality of positions of the electronic component on a plurality of wire loops included in the semiconductor package.

14 Claims, 22 Drawing Sheets

106a1

106b1

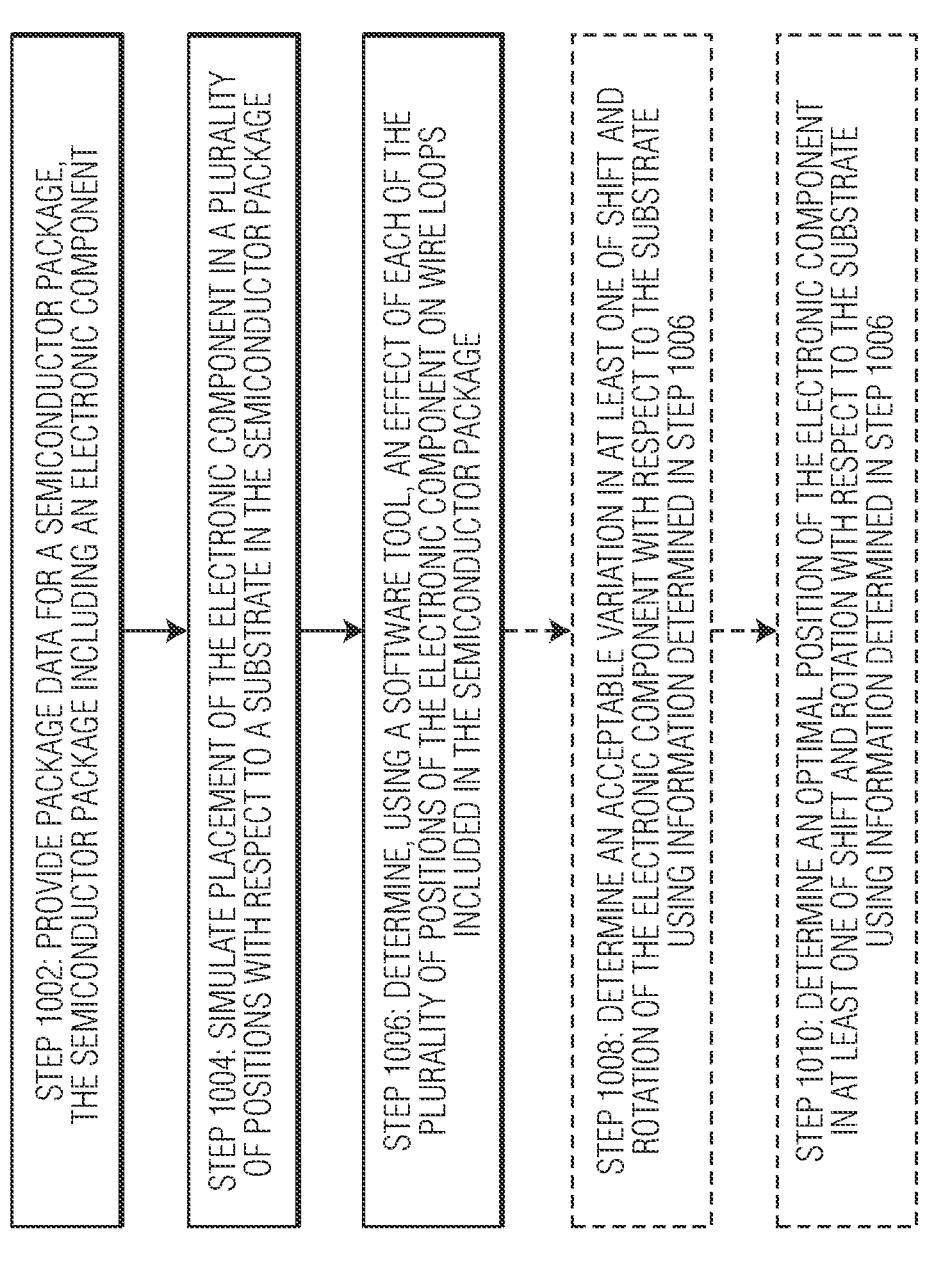

STEP 1002: PROVIDE PACKAGE DATA FOR A SEMICONDUCTOR PACKAGE, THE SEMICONDUCTOR PACKAGE INCLUDING AN ELECTRONIC COMPONENT

STEP 1004: SIMULATE PLACEMENT OF THE ELECTRONIC COMPONENT IN A PLURALITY OF POSITIONS WITH RESPECT TO A SUBSTRATE IN THE SEMICONDUCTOR PACKAGE

STEP 1006: DETERMINE, USING A SOFTWARE TOOL, AN EFFECT OF EACH OF THE PLURALITY OF POSITIONS OF THE ELECTRONIC COMPONENT ON WIRE LOOPS INCLUDED IN THE SEMICONDUCTOR PACKAGE

STEP 1008: DETERMINE AN ACCEPTABLE VARIATION IN AT LEAST ONE OF SHIFT AND ROTATION OF THE ELECTRONIC COMPONENT WITH RESPECT TO THE SUBSTRATE USING INFORMATION DETERMINED IN STEP 1006

STEP 1010: DETERMINE AN OPTIMAL POSITION OF THE ELECTRONIC COMPONENT IN AT LEAST ONE OF SHIFT AND ROTATION WITH RESPECT TO THE SUBSTRATE USING INFORMATION DETERMINED IN STEP 1006

FIG. 10

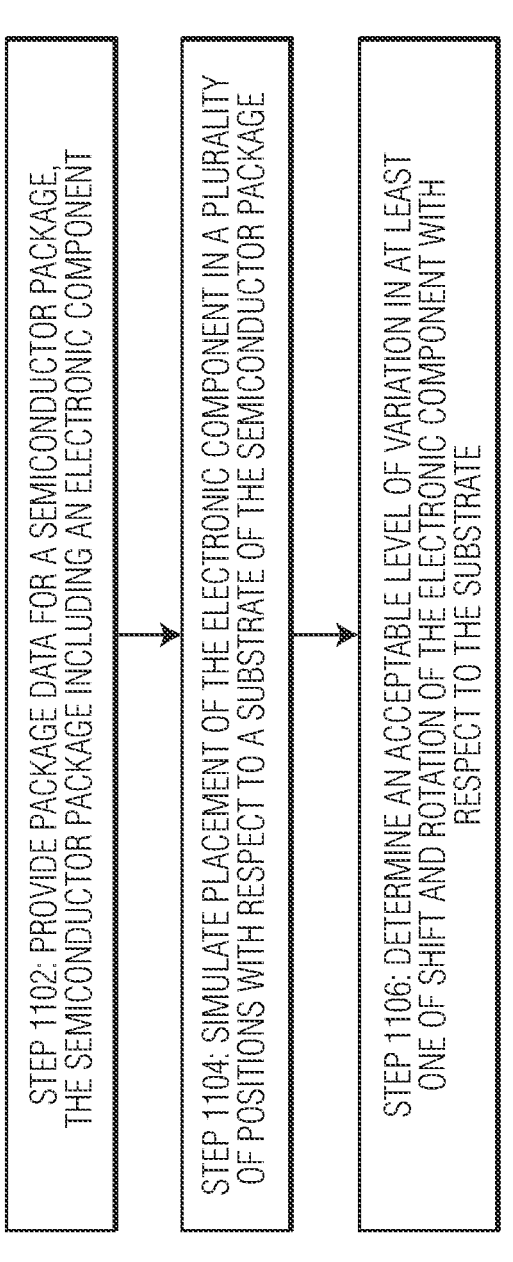

STEP 1102: PROVIDE PACKAGE DATA FOR A SEMICONDUCTOR PACKAGE, THE SEMICONDUCTOR PACKAGE INCLUDING AN ELECTRONIC COMPONENT

STEP 1104: SIMULATE PLACEMENT OF THE ELECTRONIC COMPONENT IN A PLURALITY OF POSITIONS WITH RESPECT TO A SUBSTRATE OF THE SEMICONDUCTOR PACKAGE

STEP 1106: DETERMINE AN ACCEPTABLE LEVEL OF VARIATION IN AT LEAST ONE OF SHIFT AND ROTATION OF THE ELECTRONIC COMPONENT WITH RESPECT TO THE SUBSTRATE

FIG. 11

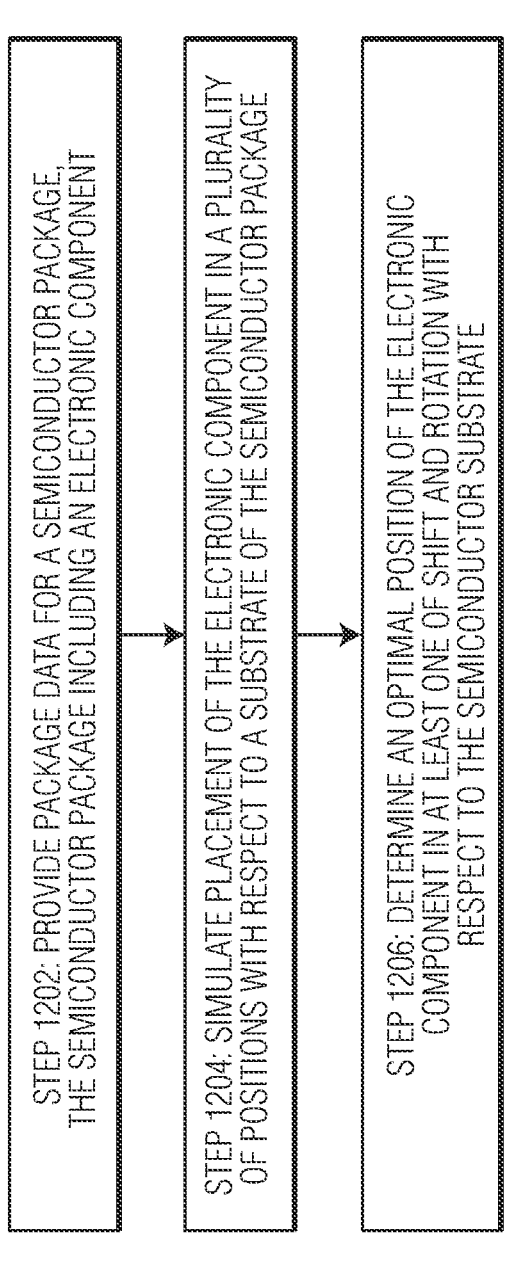

STEP 1202: PROVIDE PACKAGE DATA FOR A SEMICONDUCTOR PACKAGE, THE SEMICONDUCTOR PACKAGE INCLUDING AN ELECTRONIC COMPONENT

STEP 1204: SIMULATE PLACEMENT OF THE ELECTRONIC COMPONENT IN A PLURALITY OF POSITIONS WITH RESPECT TO A SUBSTRATE OF THE SEMICONDUCTOR PACKAGE

STEP 1206: DETERMINE AN OPTIMAL POSITION OF THE ELECTRONIC COMPONENT IN AT LEAST ONE OF SHIFT AND ROTATION WITH RESPECT TO THE SEMICONDUCTOR SUBSTRATE

FIG. 12

METHODS OF DETERMINING AN EFFECT OF ELECTRONIC COMPONENT PLACEMENT ACCURACY ON WIRE LOOPS IN A SEMICONDUCTOR PACKAGE, AND RELATED METHODS

CROSS REFERENCE TO RELATED APPLICATION

This application claims priority to U.S. Provisional Application No. 63/330,133, filed on Apr. 12, 2022, the content of which is herein incorporated by reference.

FIELD

The invention relates to wire bonding operations, and in particular, to methods of determining an effect of electronic component placement accuracy on wire loops in a semiconductor package.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding machines (e.g., stud bumping machines) are also used to form conductive bumps from portions of wire.

Semiconductor packages typically include one or more electronic components (e.g., semiconductor die, capacitors, etc.). Such electronic components are placed on a substrate of the semiconductor package. If the electronic components are not placed accurately on the substrate, wire loops included in the semiconductor package may be adversely affected.

SUMMARY

According to an exemplary embodiment of the invention, a method of determining an effect of electronic component placement accuracy on wire loops in a semiconductor package is provided. The method includes the steps of: (a) providing package data for a semiconductor package, the semiconductor package including an electronic component; (b) simulating placement of the electronic component in a plurality of positions with respect to a substrate in the semiconductor package; and (c) determining, using a software tool, an effect of each of the plurality of positions of the electronic component on a plurality of wire loops included in the semiconductor package.

According to another exemplary embodiment of the invention, a method of determining an acceptable level of variation in the placement of an electronic component in connection with a semiconductor package is provided. The method includes: (a) providing package data for a semiconductor package, the semiconductor package including an electronic component; (b) simulating placement of the electronic component in a plurality of positions with respect to a substrate of the semiconductor package; and (c) determining an acceptable level of variation in at least one of shift and rotation of the electronic component with respect to the substrate.

According to yet another exemplary embodiment of the invention, a method of determining an optimal position for placement of an electronic component in a semiconductor package is provided. The method includes: (a) providing package data for a semiconductor package, the semiconductor package including an electronic component; (b) simulating placement of the electronic component in a plurality of positions with respect to a substrate of the semiconductor package; and (c) determining an optimal position of the electronic component in at least one of shift and rotation with respect to the semiconductor package.

The methods of the invention may also be embodied as computer program instructions on a computer readable carrier (e.g., a computer readable carrier including a software used in connection with a computer on a wire bonding machine, or a computer offline from a wire bonding machine).

The various methods described herein (including the methods described in this summary portion of the application) may include any one or more of the following features: (1) the package data includes at least one of (i) CAD data related to the semiconductor package and (ii) package data derived using an online teaching reference system of a wire bonding machine; (2) the package data includes at least one of a two-dimensional wire layout of the semiconductor package, a three-dimensional wire layout of the semiconductor package, an electronic component height, bonding locations of the electronic component, bonding locations of the substrate, relative distances between first bonding locations and second bonding locations, a wire diameter, and a wire type; (3) the electronic component is configured to be placed on the substrate of the semiconductor package, and wherein the plurality of positions of the electronic component include positions where the electronic component is shifted along at least one of an x-axis and a y-axis with respect to the substrate; (4) the electronic component is configured to be placed on a substrate of the semiconductor package, and wherein the plurality of positions of the electronic component include positions where the electronic component is rotated with respect to the substrate; (5) determining the effect of each of the plurality of positions of the electronic component on short circuiting of one or more wire loops included in the semiconductor package; (6) determining the effect of each of the plurality of positions of the electronic component on clearance between a wire loop included in the semiconductor package and other structures in the semiconductor package; (7) the other structures include at least one of neighboring wire loops and other electronic components; (8) determining an acceptable variation in at least one of shift and rotation of the electronic component with respect to the substrate using information determined in a prior step of determining, using a software tool, an effect of each of the plurality of positions of the electronic component on wire loops included in the semiconductor package; (9) determining an optimal position of the electronic component in at least one of shift and rotation with respect to the substrate; (10) the electronic component is a semiconductor die; (11) at least one of the wire loops is configured to be bonded to the electronic component; and (12) wire loops are not configured to be bonded to the electronic component (e.g., the wire loops that are relevant to the invention are not being bonded to the electronic component).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 10 is a flow diagram illustrating a method of determining an effect of electronic component placement accuracy on wire loops in a semiconductor package in accordance with an exemplary embodiment of the invention;

FIG. 11 is a flow diagram illustrating a method of determining an acceptable level of variation in the placement of an electronic component in connection with a semiconductor package in accordance with another exemplary embodiment of the invention; and FIG. 12 is a flow diagram illustrating a method of determining an optimal position for placement of an electronic component in a semiconductor package in accordance with yet another exemplary embodiment of the invention.

DETAILED DESCRIPTION

Figure 1A:
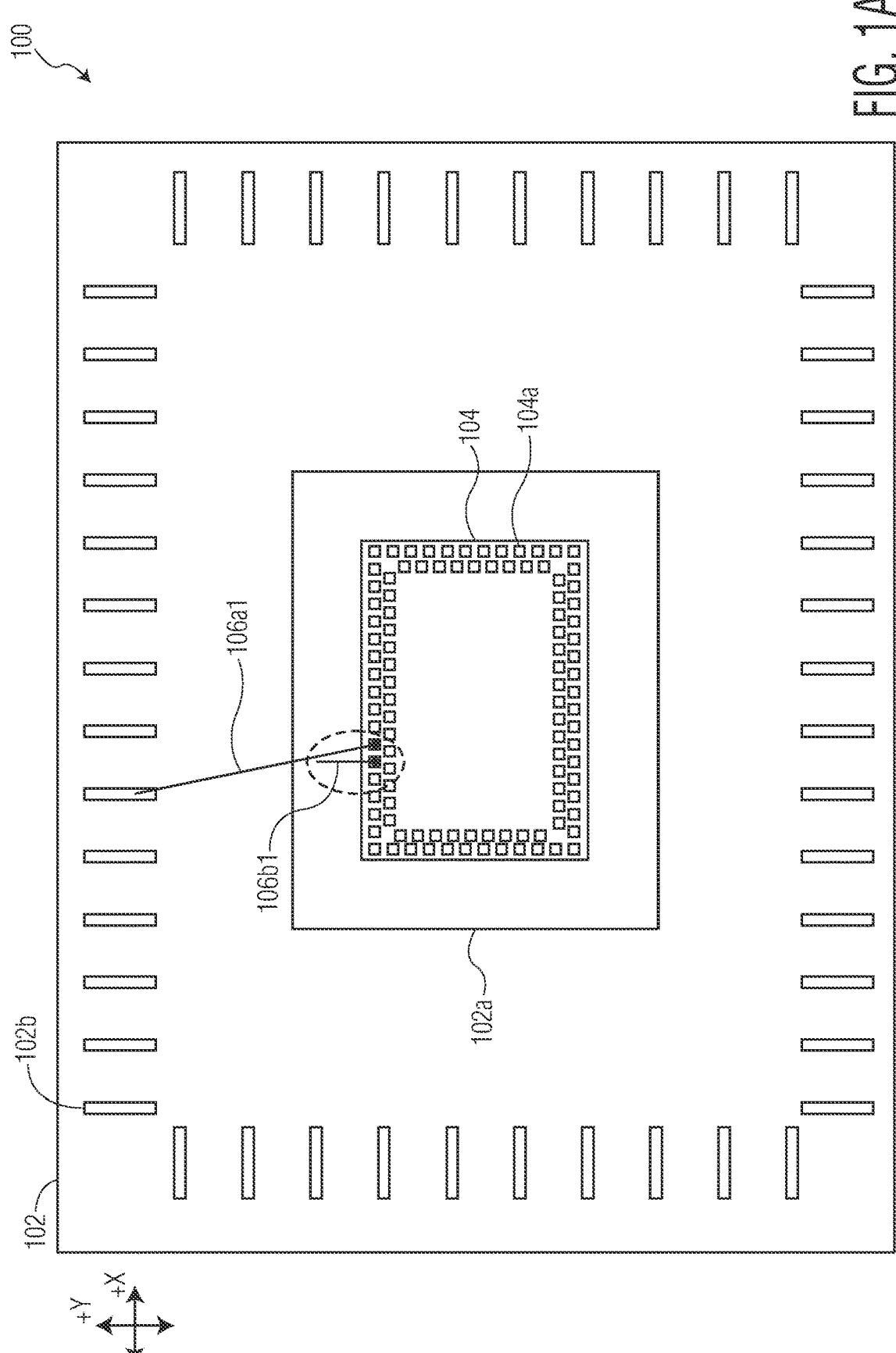
FIG. 1A is a top view block diagram illustrating a semiconductor package, useful for explaining various exemplary embodiments of the invention.

According to various exemplary embodiments of the invention, simulations are performed for (i) shift (e.g., at least one of shift along the x-axis and the y-axis) and/or (ii) rotation of an electronic component, for example, during placement of the electronic component on a substrate. Further, the impact of the shift and/or rotation on semiconductor package manufacturing yield and performance may be determined.

In complex semiconductor packages (such as SiPs), the placement of various electronic components (e.g., semiconductor die) can affect the manufacturability of the packages. Variations and errors in component placement (such as shift and/or rotation) can significantly affect package yield. For instance, an unacceptable amount of shift or rotation of an electronic component during placement onto a substrate can result in unacceptable short circuiting of one or more wire loops included in the semiconductor package (or a lack of clearance of one or more wire loops with adjacent wire loops of other structures).

Aspects of the invention involve simulating (e.g., using software or a "software tool") position changes by: (i) shifting (e.g., along the x-axis, along the y-axis, along both the x-axis and the y-axis) a position of one or more electronic components; and/or (ii) rotating (in degrees) a position of one or more electronic components. Such simulations may be used for a number of purposes, such as: (a) to determine the effect of the position changes on wire loop shorts and/or wire loops clearance, which impacts the overall yield of the package; (b) to use information from the simulations to improve the shape of one or more wire loops in the semiconductor package to be more tolerant to variation in the positions; (c) to determine (e.g., to compute using software) an acceptable amount of variation in shift and/or rotation an electronic component; and (d) to determine (e.g., using software) an optimal placement of an electronic component (e.g., a semiconductor die) in shift and/or rotation to improve the overall semiconductor package design and yield, and to reduce cost (e.g., to reduce overall wire length to save wire cost) while the semiconductor package is still in the design phase.

The inventive techniques (e.g., position simulations of electronic components in a semiconductor package) described herein can satisfy a number of purposes, for example: to detect any potential interference and/or clearance issues between wire loops as a result of electronic component placement variation; to optimize (and/or re-optimize) the wire loop shapes and/or wire looping parameters to be more tolerant to electronic component placement variation; to validate a design of a semiconductor package; to establish specifications for placement of electronic components, thereby reducing the development cycles and overall time to market for the product.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "electronic component" is intended to refer to any component configured to be "placed" on or "bonded" to a substrate of a semiconductor package. Exemplary electronic components include semiconductor elements (e.g., semiconductor die), SMT (surface mount technology) components, passive components (e.g., capacitors, transistors, diodes, etc.), etc.

As used herein, the term "substrate" is intended to refer to any structure to which a semiconductor element and/or other electronic component may be bonded or otherwise placed. Exemplary substrates include, for example, a leadframe, a PCB, a carrier, a module, a semiconductor chip, a semiconductor wafer, a BGA substrate, another semiconductor element, etc.

As used herein, the term "package data" is intended to refer to data related to a given semiconductor package. Examples of information included in such package data may include a two-dimensional (and/or three-dimensional) wire layout of the semiconductor package, electronic component (e.g., die) height, bonding locations of an electronic component (e.g., die pad locations), bonding locations of a substrate (e.g., lead locations of a leadframe), relative distances between first bonding locations and second bonding locations, wire diameter, and wire type. Package data may be provided in various ways, for example: (i) a computer aided design ("CAD") model; or (2) an online teaching reference system model (or derivations thereof).

As used herein, the term "semiconductor package" is intended to refer to any workpiece including a semiconductor element. It will be appreciated that certain semiconductor packages (as illustrated and described herein) are not shown as fully "packaged", but rather in a state of partial assembly for purposes of illustration and simulation. While the invention is illustrated and described herein primarily with respect to simple semiconductor packages (e.g., a semiconductor element on a substrate, such as a semiconductor die on a leadframe), it is not limited thereto. Aspects of the invention have particular applicability to more complicated semiconductor packages such as high-pin count packages, stack die packages, SiP packages, SMT packages, etc.

Referring now to FIG. 1A, a semiconductor package 100 is illustrated. Semiconductor package 100 includes a substrate 102 and an electronic component 104 (e.g., a semiconductor die) including a plurality of bonding locations 104a. Substrate 102 (e.g., a leadframe or other substrate) includes a conductive substrate region 102a (e.g., a die paddle of a leadframe) and a plurality of bonding locations 102b (e.g., leads of a leadframe). In this illustration, electronic component 104 is shown in a design location on substrate 102 (e.g., an initial location planned according to package data of semiconductor package 100). A wire loop 106b1 has been formed between bonding location 104a of electronic component 104 (e.g., a "first bond" location) and conductive substrate region 102a (e.g., a "second bond" location). Another wire loop 106a1 has been formed between one of the plurality of bonding locations 104a of electronic component 104 and one of the plurality of bonding locations 102b of substrate 102.

In FIG. 1A (and in other examples shown throughout the various drawings), semiconductor package 100 is illustrated in a simplified form with just two wire loops (i.e., wire loop 106a1 and wire loop 106b1). However, it is understood that semiconductor package 100 may include many additional wire loops (e.g., wire loops connecting other various bonding locations). Further, semiconductor package 100 may include additional electronic components.

Figure 1B:
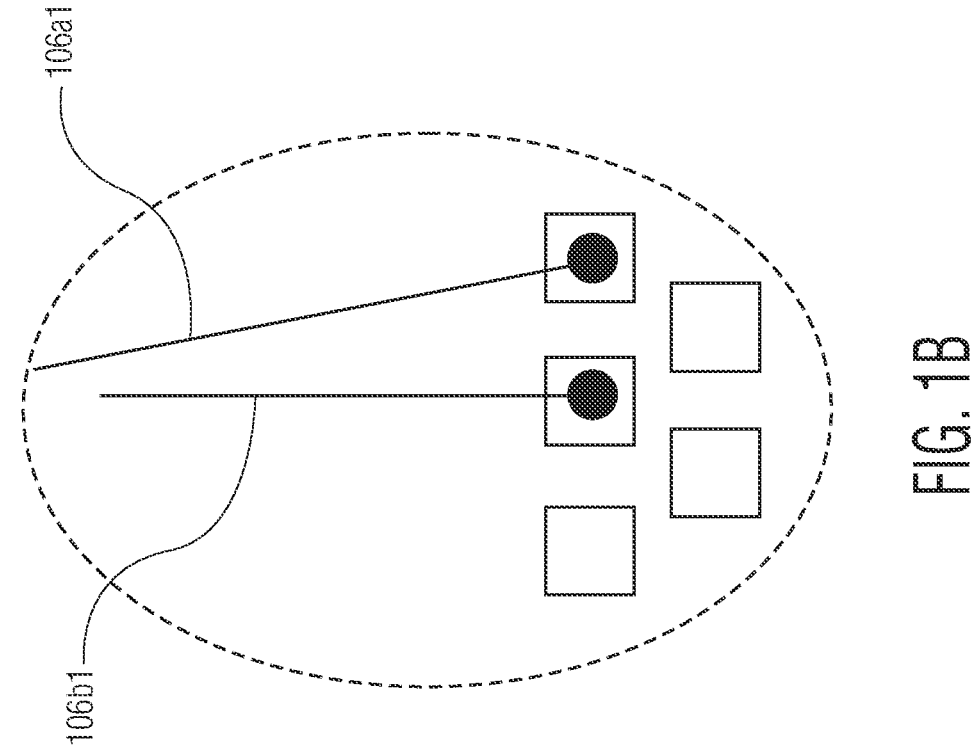
FIG. 1B is a detailed view of a portion of FIG. 1A.
Figure 1B:
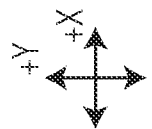

Referring now to FIG. 1B, a detailed view of a portion of FIG. 1A is illustrated. In this detailed view, the proximity of wire loop 106a1 to wire loop 106b1 is more clearly illustrated. The relative positioning of wire loops 106a1 and 106b1 (i.e., the wire loops formed in a design placement of electronic component 104) is useful in explaining the relative movement of wire loop simulations in other figures (e.g., FIGS. 2A-2B, 3A-3B, 4A-4B, 5A-5B, and 6A-6B).

Referring to FIGS. 2A-2B, FIGS. 3A-3B, FIGS. 4A-4B, FIGS. 5A-5B, FIGS. 6A-6B, FIGS. 7A-7B, and FIGS. 9A-9D, various simulations of placement of an electronic component with respect to a substrate of a semiconductor package are illustrated. As will be appreciated by those skilled in the art, the simulations shown in these drawings are illustrative. The actual simulations may occur, for example, in software using package data related to the semiconductor package, and position data of an electronic component. Nonetheless, these drawings are useful to illustrate the effect of variations in the placement of the electronic component with respect to the substrate.

Figure 2A:
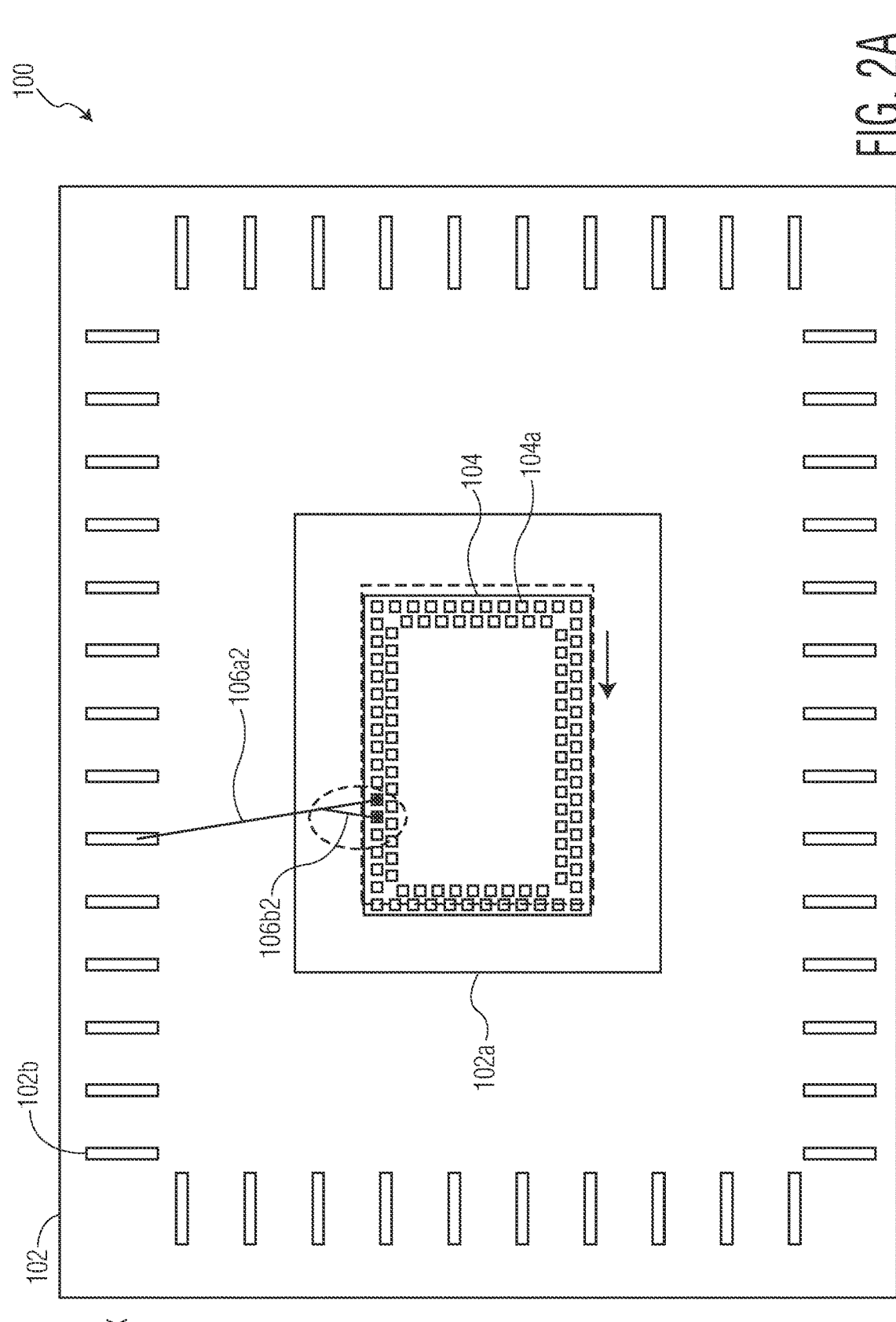
FIG. 2A is a top view block diagram illustrating simulation of placement of an electronic component in accordance with an exemplary embodiment of the invention.

Referring now to FIG. 2A, the placement of electronic component 104 is simulated in a position to the left of a design placement (i.e., the placement of electronic component 104 in FIG. 1A) with respect to substrate 102 of semiconductor package 100. In other words, electronic component 104 has been "shifted" to the left as compared to the placement of electronic component 104 in FIG. 1A (where the dotted line box in FIG. 2A represents the position of electronic component 104 from FIG. 1A). Consequently, a wire loop 106b2 and a wire loop 106a2 are affected by the shift in placement. The effect on wire loops 106a2 and 106b2 is more clearly illustrated in FIG. 2B.

Figure 2B:
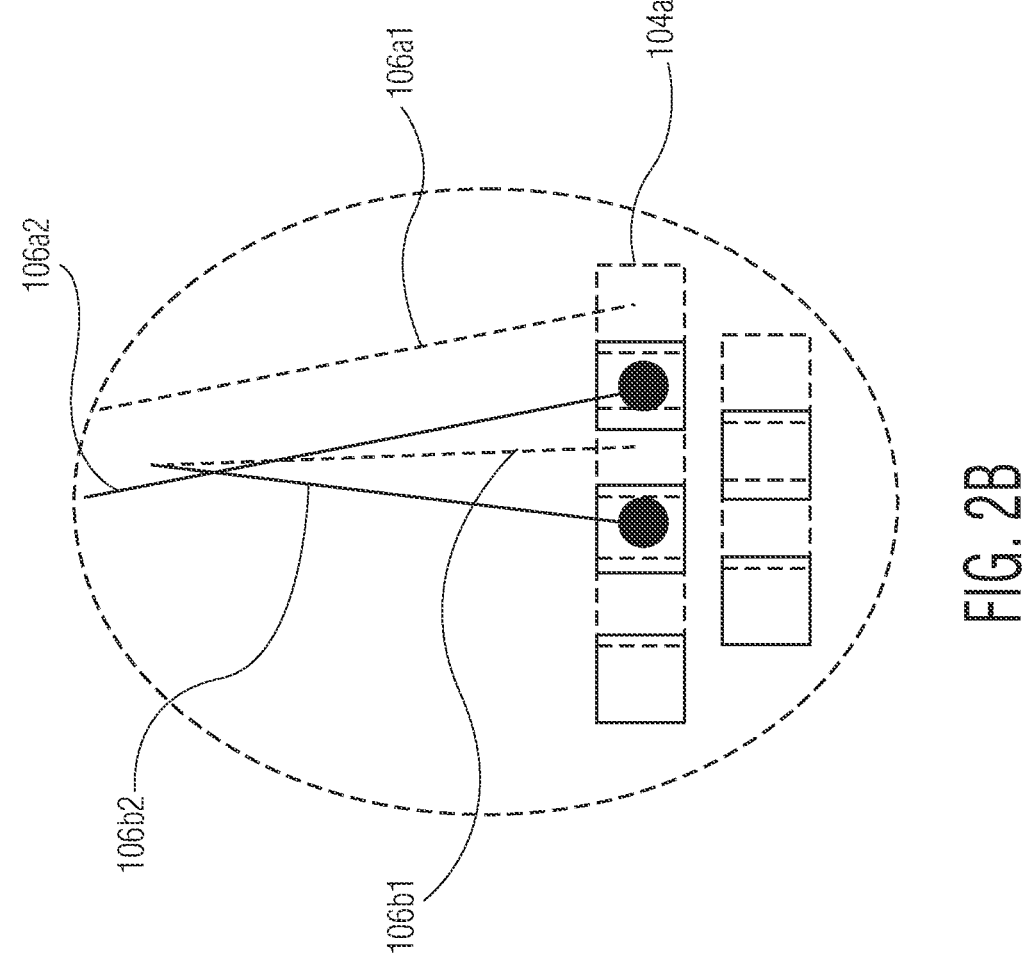
FIG. 2B is a detailed view of a portion of FIG. 2A.
Figure 2B:
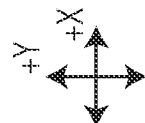

In FIG. 2B, a detailed view of a portion of FIG. 2A is illustrated. In order to show the effect of the movement of electronic component 104 from FIG. 1A to FIG. 2A, FIG. 2B shows wire loops 106a1/106b1 in a dashed line form and bonding locations 104a in both a solid line form and a dashed line form. The solid line form of wire loops 106a2/106b2 show their positions from FIG. 2A, and the dashed line form show their positions (i.e., wire loops 106a1/106b1) from FIG. 1A. In this detailed view, the proximity of wire loop 106a2 to wire loop 106b2 is more clearly illustrated. As a result of the shifted placement of electronic component 104, wire loop 106b2 interferes with (e.g., is in contact with) wire loop 106a2. For example, in this simulation, the second bond of wire loop 106b2 (i.e., the end of wire farther away in the +Y direction from bonding locations 104a) is located at the same position as the second bond of wire loop 106b1; consequently, when electronic component 104 is shifted to the left (i.e., −X direction), the orientation of wire loop 106b2 changes with respect to the orientation of wire loop 106b1 (and/or substrate 102). Simultaneously, as a result of electronic component 104 shifting to the left, the position and orientation of wire loop 106a2 changes, causing interference with wire loop 106b2. The extent of the effect on wire loops caused by this simulated placement (i.e., the relative shift to the left) of electronic component 104 can be determined using a software tool.

Figure 3A:
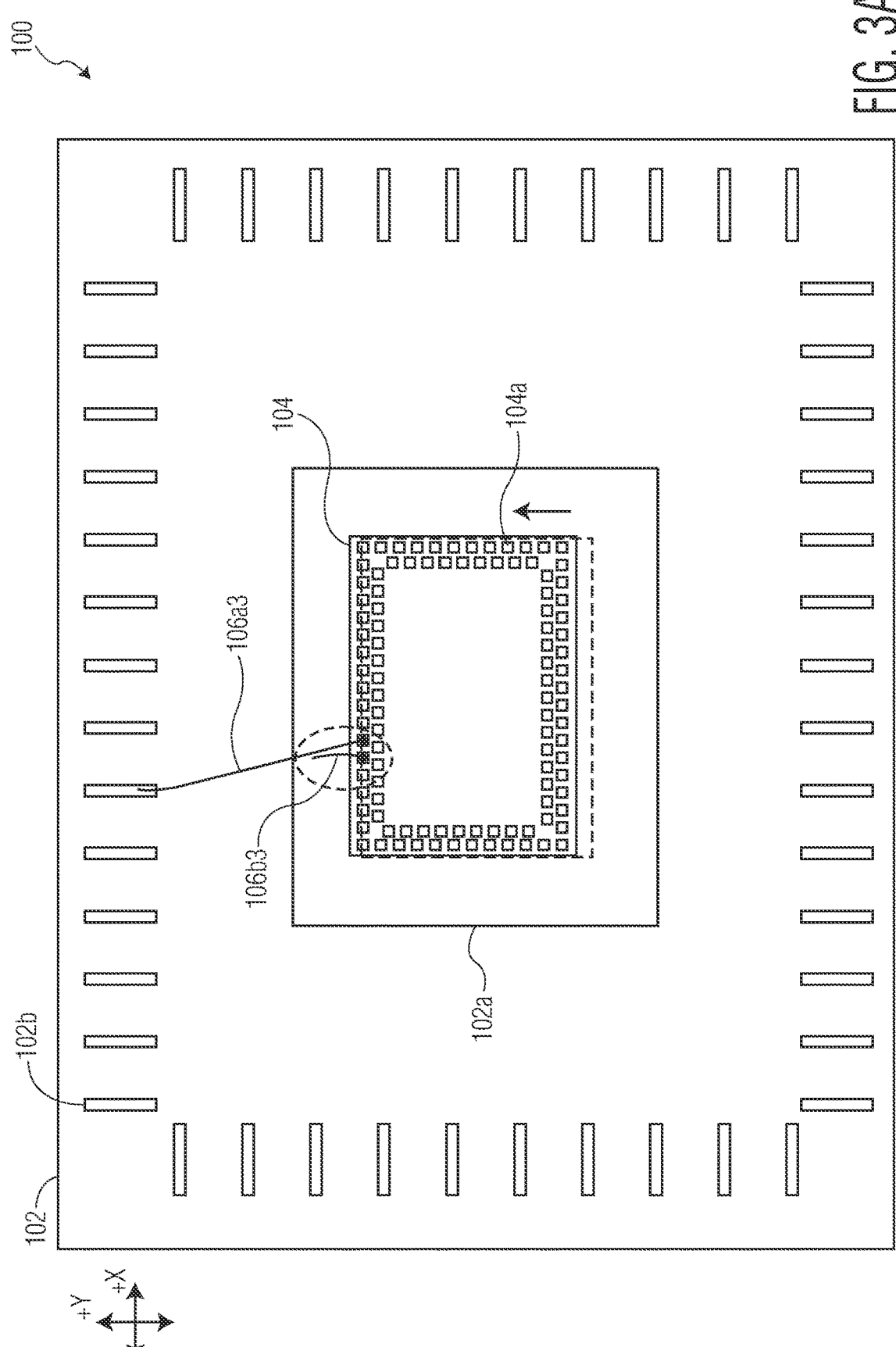
FIG. 3A is a top view block diagram illustrating simulation of placement of an electronic component in accordance with another exemplary embodiment of the invention.

Referring now to FIG. 3A, the placement of electronic component 104 is simulated in a position up (i.e., in the +Y direction) from a design placement (i.e., the placement of electronic component 104 in FIG. 1A) with respect to substrate 102 of semiconductor package 100. In other words, electronic component 104 has been "shifted" upward as compared to the placement of electronic component 104 in FIG. 1A (the dotted line box in FIG. 3A represents the position of electronic component 104 from FIG. 1A). Consequently, a wire loop 106*b*3 and a wire loop 106*a*3 are affected by the shift in placement. The effect on wire loops 106*a*3 and 106*b*3 is more clearly illustrated in FIG. 3B.

Figure 3B:
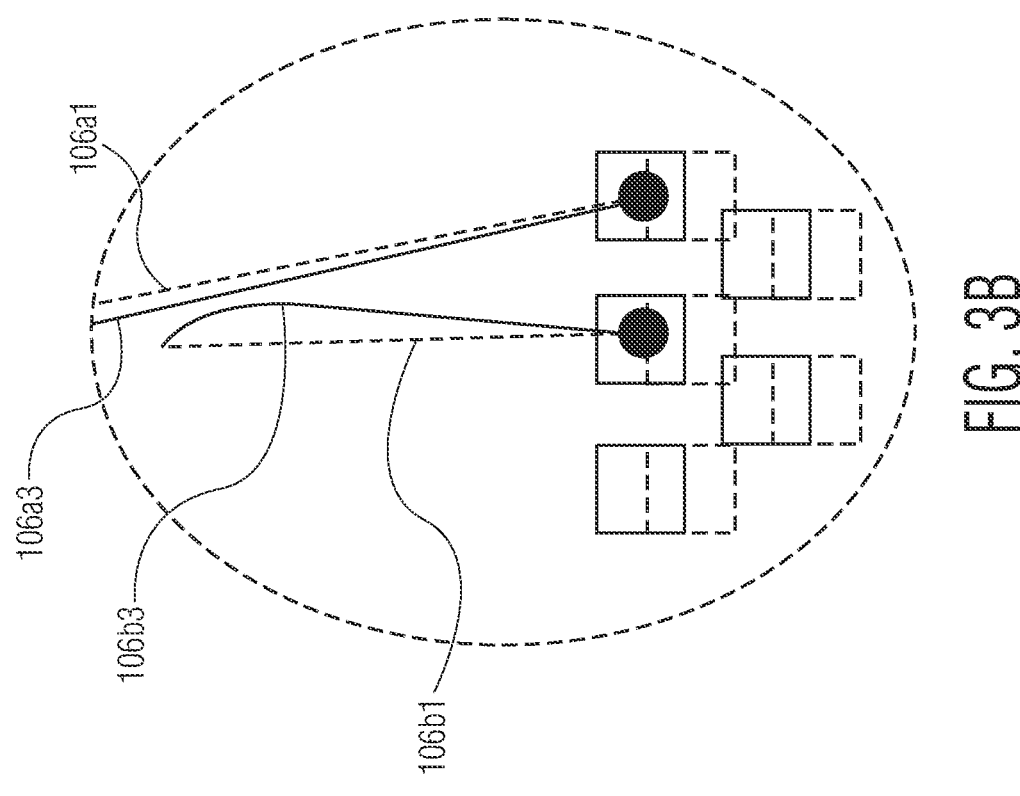
FIG. 3B is a detailed view of a portion of FIG. 3A.

In FIG. 3B, a detailed view of a portion of FIG. 3A is illustrated. In order to show the effect of the movement of electronic component 104 from FIG. 1A to FIG. 3A, FIG. 3B shows wire loops 106*a*1/106*b*1 in a dashed line form and bonding locations 104*a* in both a solid line form and a dashed line form. The solid line form of wire loops 106*a*3/106*b*3 show their positions from FIG. 3A, and the dashed line form show their positions (i.e., wire loops 106*a*1/106*b*1) from FIG. 1A. In this detailed view, the proximity of wire loop 106*a*3 to wire loop 106*b*3 is more clearly illustrated. As a result of the shifted placement of electronic component 104, wire loop 106*b*3 nearly interferes with wire loop 106*a*3. For example, in this simulation, the second bond of wire loop 106*b*3 (i.e., the end of the wire farther away in the +Y direction from bonding locations 104*a*) is located at the same position as the second bond of wire loop 106*b*1; consequently, when electronic component 104 is shifted upward (i.e., +Y direction), the orientation of the wire loop 106*b*3 changes with respect to the orientation of wire loop 106*b*1 (and/or substrate 102) due to the wire loop being compressed from having its bond locations closer together than the design placement (e.g., the wire loop forms more of an arc rather than a straight line). Simultaneously, as a result of electronic component 104 shifting upward, the position and orientation of wire loop 106*a*3 changes, nearly causing interference with wire loop 106*b*3. The extent of the effect on wire loops caused by this simulated placement (i.e., the relative shift up) of electronic component 104 can be determined using a software tool.

Figure 4A:
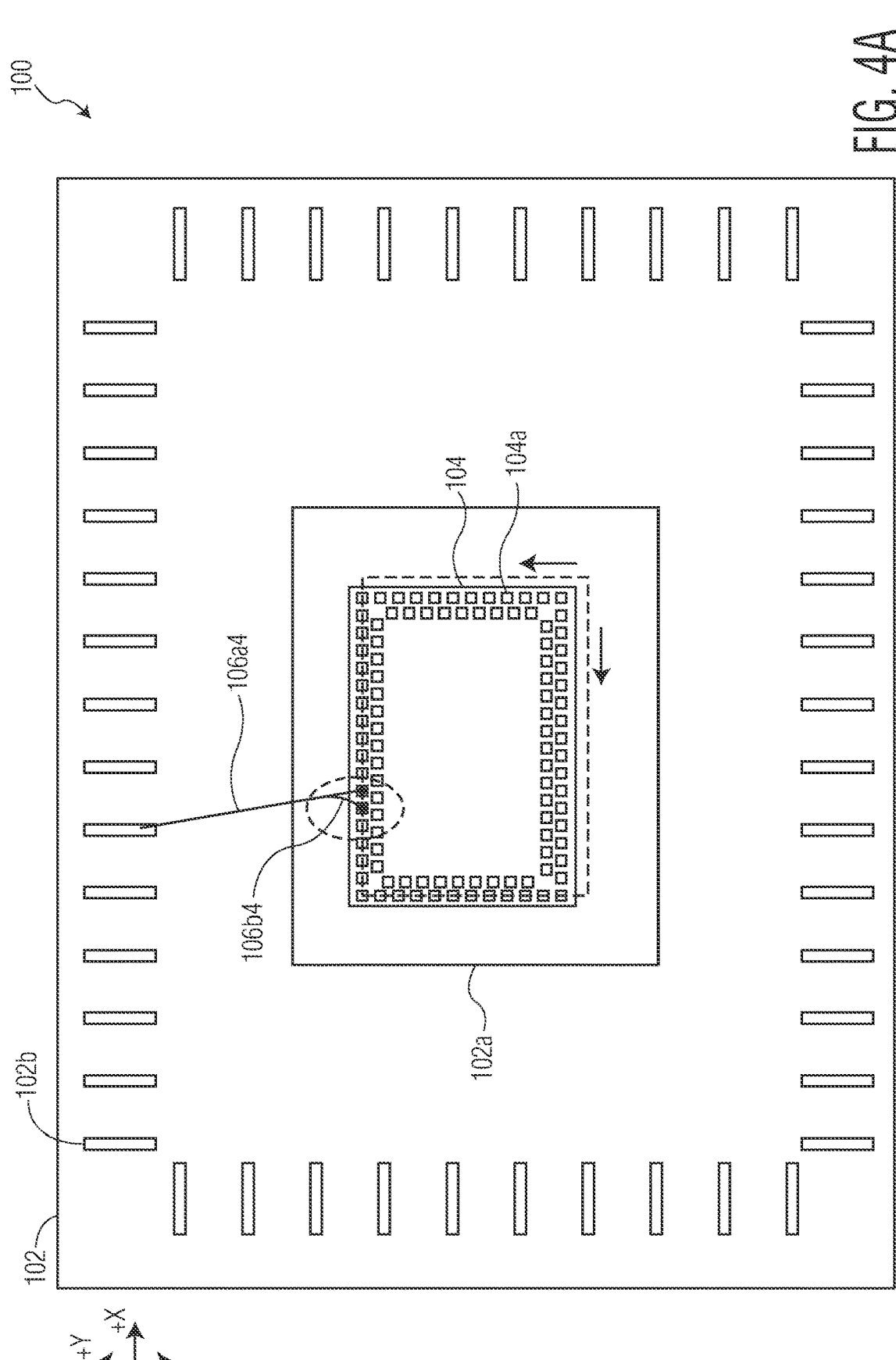
FIG. 4A is a top view block diagram illustrating simulation of placement of an electronic component in accordance with yet another exemplary embodiment of the invention.

Referring now to FIG. 4A, the placement of electronic component 104 is simulated in a position to the left (i.e., in the −X direction) and up (i.e., in the +Y direction) from a design placement (i.e., the placement of electronic component 104 in FIG. 1A) with respect to substrate 102 of semiconductor package 100. In other words, electronic component 104 has been "shifted" to the left and upward as compared to the placement of electronic component 104 in FIG. 1A (the dotted line box in FIG. 4A represents the position of electronic component 104 from FIG. 1A). Consequently, a wire loop 106*b*4 and a wire loop 106*a*4 are affected by the shift in placement. The effect on wire loops 106*a*4 and 106*b*4 is more clearly illustrated in FIG. 4B.

Figure 4B:
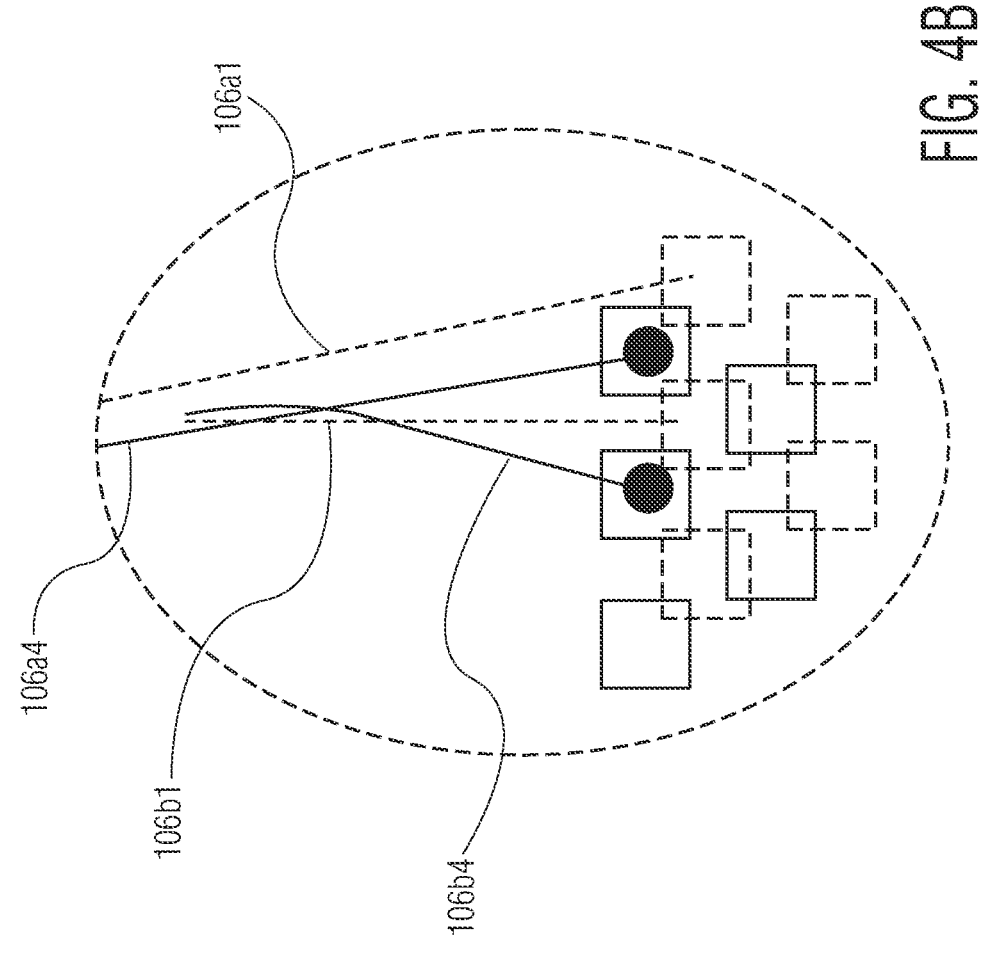
FIG. 4B is a detailed view of a portion of FIG. 4A.

In FIG. 4B, a detailed view of a portion of FIG. 4A is illustrated. In order to show the effect of the movement of electronic component 104 from FIG. 1A to FIG. 4A, FIG. 4B shows wire loops 106*a*1/106*b*1 in a dashed line form and bonding locations 104*a* in both a solid line form and a dashed line form. The solid line form of wire loops 106*a*4/106*b*4 show their positions from FIG. 4A, and the dashed line form show their positions (i.e., wire loops 106*a*1/106*b*1) from FIG. 1A. In this detailed view, the proximity of wire loop 106*a*4 to wire loop 106*b*4 is more clearly illustrated. As a result of the shifted placement of electronic component 104, wire loop 106*b*4 interferes with (e.g., is in contact with) wire loop 106*a*4. For example, in this simulation, the second bond of wire loop 106*b*4 (i.e., the end of the wire farther away in the +Y direction from bonding locations 104*a*) is located at the same position as the second bond of wire loop 106*b*1; consequently, when electronic component 104 is shifted to the left (i.e., −X direction) and upward (i.e., +Y direction), the orientation of the wire loop 106*b*4 changes with respect to the orientation of wire loop 106*b*1 (and/or substrate 102). Simultaneously, as a result of electronic component 104 shifting to the left and upward, the position and orientation of wire loop 106*a*4 changes, causing interference with wire loop 106*b*4. The extent of the effect on wire loops caused by this simulated placement (i.e., the relative shift up and to the left) of electronic component 104 can be determined using a software tool.

Figure 5A:
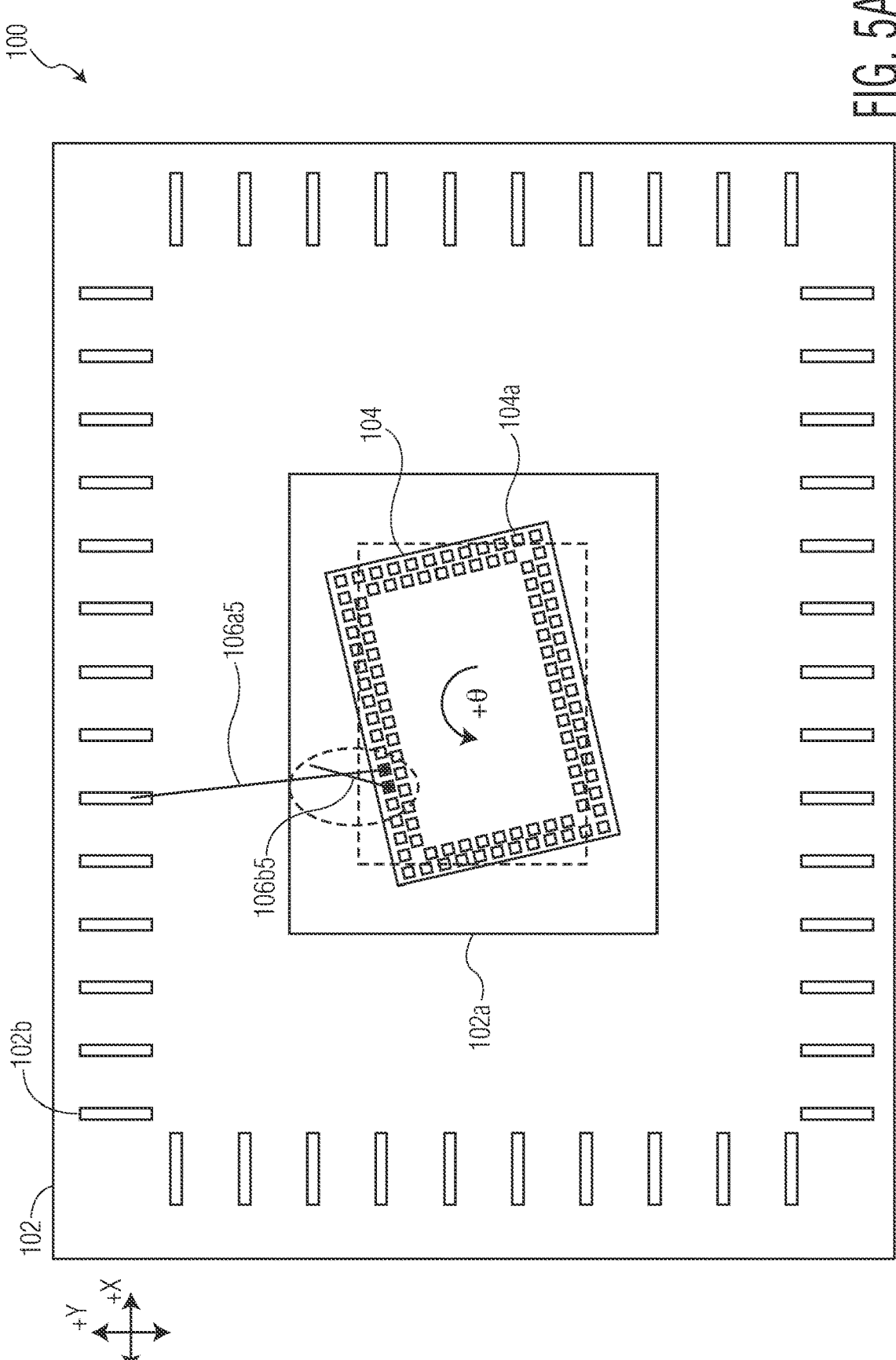
FIG. 5A is a top view block diagram illustrating simulation of placement of an electronic component in accordance with yet another exemplary embodiment of the invention.

Referring now to FIG. 5A, the placement of electronic component 104 is simulated in a rotated position (i.e., in +θ) from a design placement (i.e., the placement of electronic component 104 in FIG. 1A) with respect to substrate 102 of semiconductor package 100. In other words, electronic component 104 has been rotated compared to the placement of electronic component 104 in FIG. 1A (the dotted line box in FIG. 5A represents the position of electronic component 104 from FIG. 1A). Consequently, a wire loop 106*b*5 and a wire loop 106*a*5 are affected by the rotation in placement. The effect on wire loops 106*a*5 and 106*b*5 is more clearly illustrated in FIG. 5B.

Figure 5B:
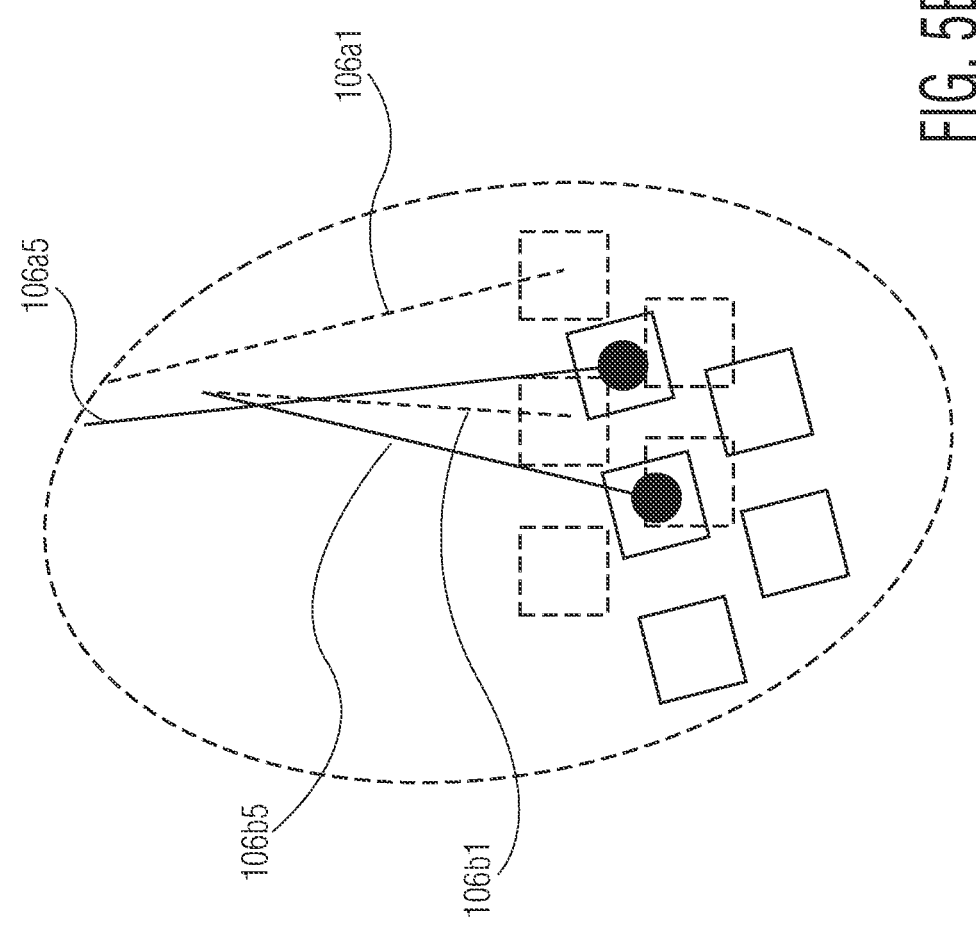
FIG. 5B is a detailed view of a portion of FIG. 5A.

In FIG. 5B, a detailed view of a portion of FIG. 5A is illustrated. In order to show the effect of the movement of electronic component 104 from FIG. 1A to FIG. 5A, FIG. 5B shows wire loops 106*a*1/106*b*1 in a dashed line form and bonding locations 104*a* in both a solid line form and a dashed line form. The solid line form of wire loops 106*a*5/106*b*5 show their positions from FIG. 5A, and the dashed line form shows their positions (i.e., wire loops 106*a*1/106*b*1) from FIG. 1A. In this detailed view, the proximity of wire loop 106*a*5 to wire loop 106*b*5 is more clearly illustrated. As a result of the rotated placement of electronic component 104, wire loop 106*b*5 interferes with (e.g., is in contact with) wire loop 106*a*5. For example, in this simulation, the second bond of wire loop 106*b*5 (i.e., the end of the wire farther away in the +Y direction from bonding locations 104*a*) is located at the same position as the second bond of wire loop 106*b*1; consequently, when electronic component 104 is rotated, the orientation of the wire loop 106*b*5 changes with respect to the orientation of wire loop 106*b*1 (and/or substrate 102). Simultaneously, as a result of electronic component 104 rotating, the position and orientation of wire loop 106*a*5 changes, causing interference with wire loop 106*b*5. The extent of the effect on wire loops caused by this simulated placement (i.e., rotation) of electronic component 104 can be determined using a software tool.

Figure 6A:
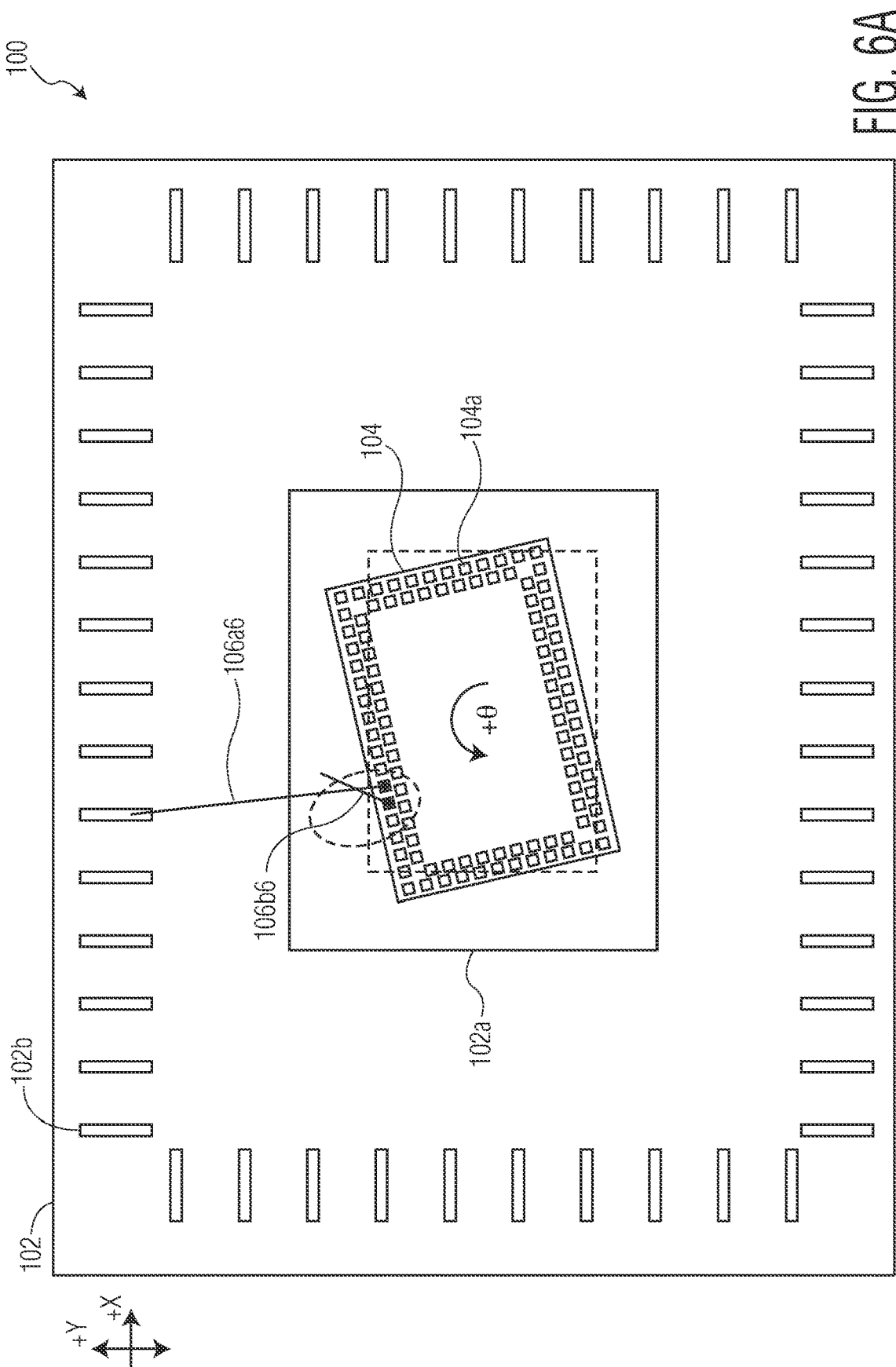
FIG. 6A is a top view block diagram illustrating simulation of placement of an electronic component in accordance with yet another exemplary embodiment of the invention.

Referring now to FIG. 6A, the placement of electronic component 104 is simulated in a rotated (i.e., in +θ), shifted to the left (i.e., in the −X direction), and shifted upward (i.e., in the +Y direction) position from a design placement (i.e., the placement of electronic component 104 in FIG. 1A) with respect to substrate 102 of semiconductor package 100. In other words, electronic component 104 has been rotated and shifted to the left and upward as compared to the placement of electronic component 104 in FIG. 1A (the dotted line box in FIG. 6A represents the position of electronic component 104 from FIG. 1A). Consequently, a wire loop 106*b*6 and a wire loop 106*a*6 are affected by the shift and rotation in placement. The effect on wire loops 106*a*6 and 106*b*6 is more clearly illustrated in FIG. 6B.

Figure 6B:
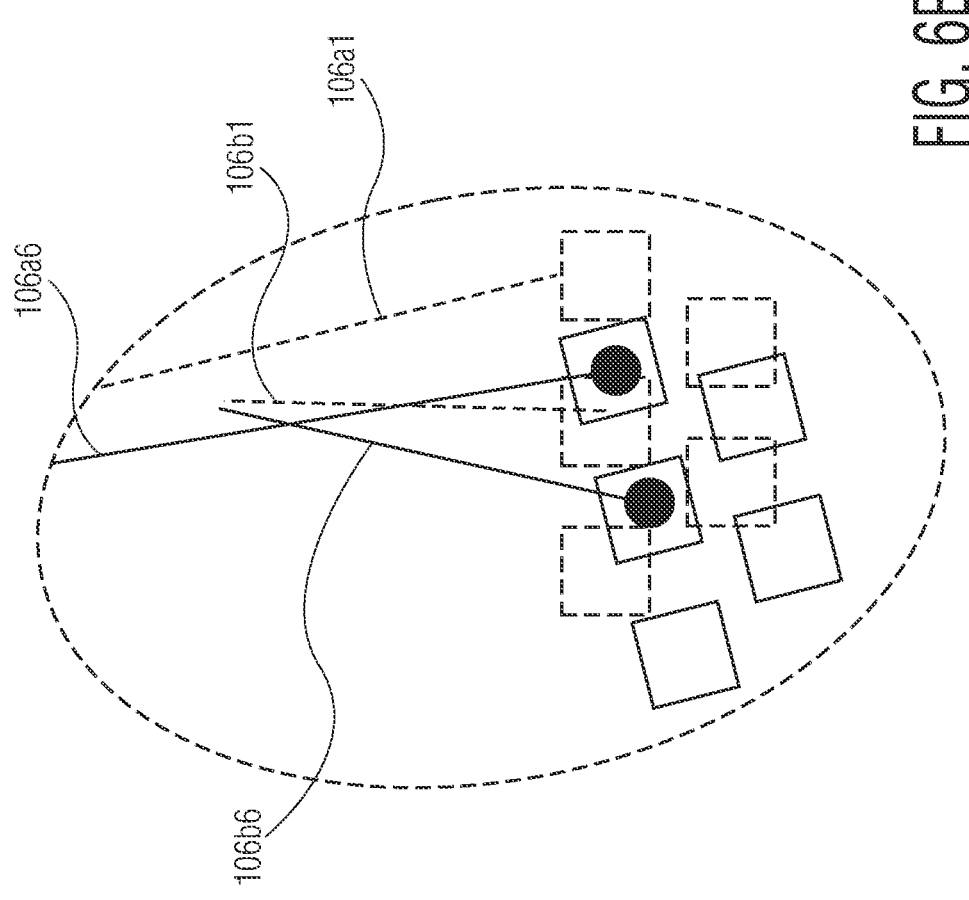
FIG. 6B is a detailed view of a portion of FIG. 6A.
Figure 6B:
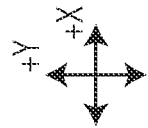

In FIG. 6B, a detailed view of a portion of FIG. 6A is illustrated. In order to show the effect of the movement of electronic component 104 from FIG. 1A to FIG. 6A, FIG. 6B shows wire loops 106a1/106b1 in a dashed line form and bonding locations 104a in both a solid line form and a dashed line form. The solid line form of wire loops 106a6/106b6 show their positions from FIG. 6A, and the dashed line form shows their positions (i.e., wire loops 106a1/106b1) from FIG. 1A. In this detailed view, the proximity of wire loop 106a6 to wire loop 106b6 is more clearly illustrated. As a result of the shifted and rotated placement of electronic component 104, wire loop 106b6 interferes with (e.g., is in contact with) wire loop 106a6. For example, in this simulation, the second bond of wire loop 106b6 (i.e., the end of the wire farther away in the +Y direction from bonding locations 104a) is located at the same position as the second bond of wire loop 106b1; consequently, when electronic component 104 is shifted and rotated, the orientation of the wire loop 106b6 changes with respect to the orientation of wire loop 106b1 (and/or substrate 102). Simultaneously, as a result of electronic component 104 shifting and rotating, the position and orientation of wire loop 106a6 changes, causing interference with wire loop 106b6. The extent of the effect on wire loops caused by this simulated placement (i.e., rotated and shifted) of electronic component 104 can be determined using a software tool.

Figure 7A:
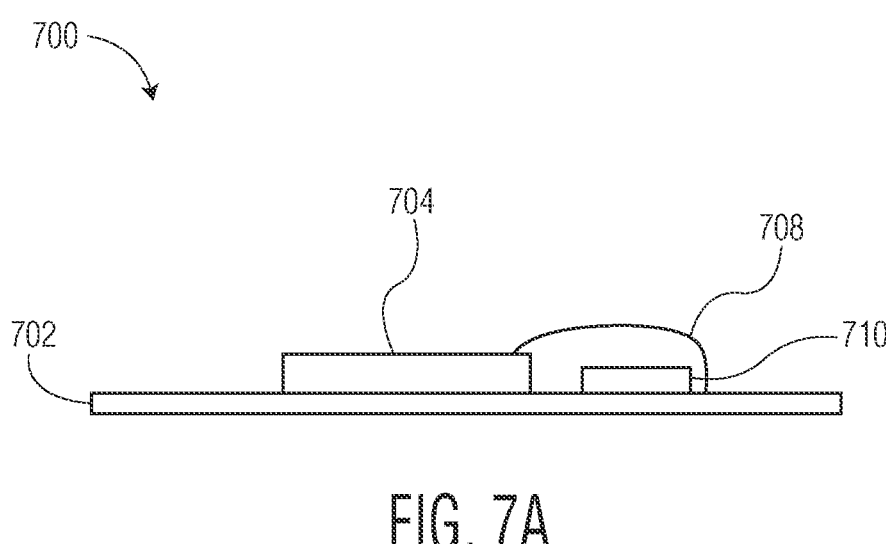
FIG. 7A is a side view block diagram illustrating design placement of an electronic component in accordance with yet another exemplary embodiment of the invention.
Figure 7B:
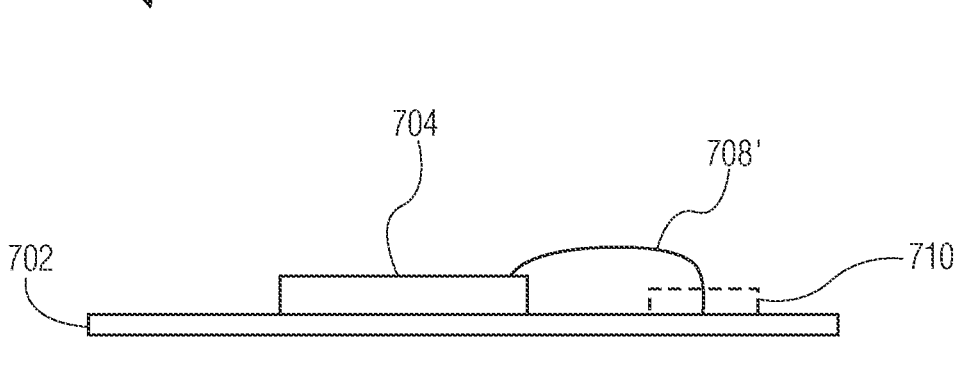
FIG. 7B is a side view block diagram illustrating simulation of placement of an electronic component in a different position as compared to FIG. 7A, in accordance with yet another exemplary embodiment of the invention.

In the simulations shown in FIGS. 2A-2B, FIGS. 3A-3B, FIGS. 4A-4B, FIGS. 5A-5B, and FIGS. 6A-6B, the illustrated wire loops are bonded to the electronic component simulated in a new position (e.g., a position different from the design placement shown in FIGS. 1A-1B). However, aspects of the invention are also applicable to simulated placement of an electronic component—where wire loops (or at least the wire loops under consideration in this example) are not configured to be bonded to the electronic component. FIGS. 7A-7B illustrate an example of such an embodiment (where wire loops are not configured to be bonded to electronic component 710).

Referring now to FIGS. 7A-7B, a semiconductor package 700 is illustrated. Semiconductor package 700 includes a substrate 702, an electronic component 704, and an electronic component 710. Referring specifically to FIG. 7A, electronic component 710 is placed in a "design placement" position. Based on provided package data of semiconductor package 700, there is adequate spacing between electronic component 704 and electronic component 710 such that a wire loop 708 may be formed between electronic component 704 and substrate 702 over electronic component 710.

Referring now to FIG. 7B, electronic component 710 is simulated as having been shifted to the right (i.e., the +X direction). Consequently, there is inadequate spacing between electronic component 704 and electronic component 710 such that a wire loop 708' may not be formed with proper clearance. This determination may be made using a software tool (not illustrated).

Figure 8A:
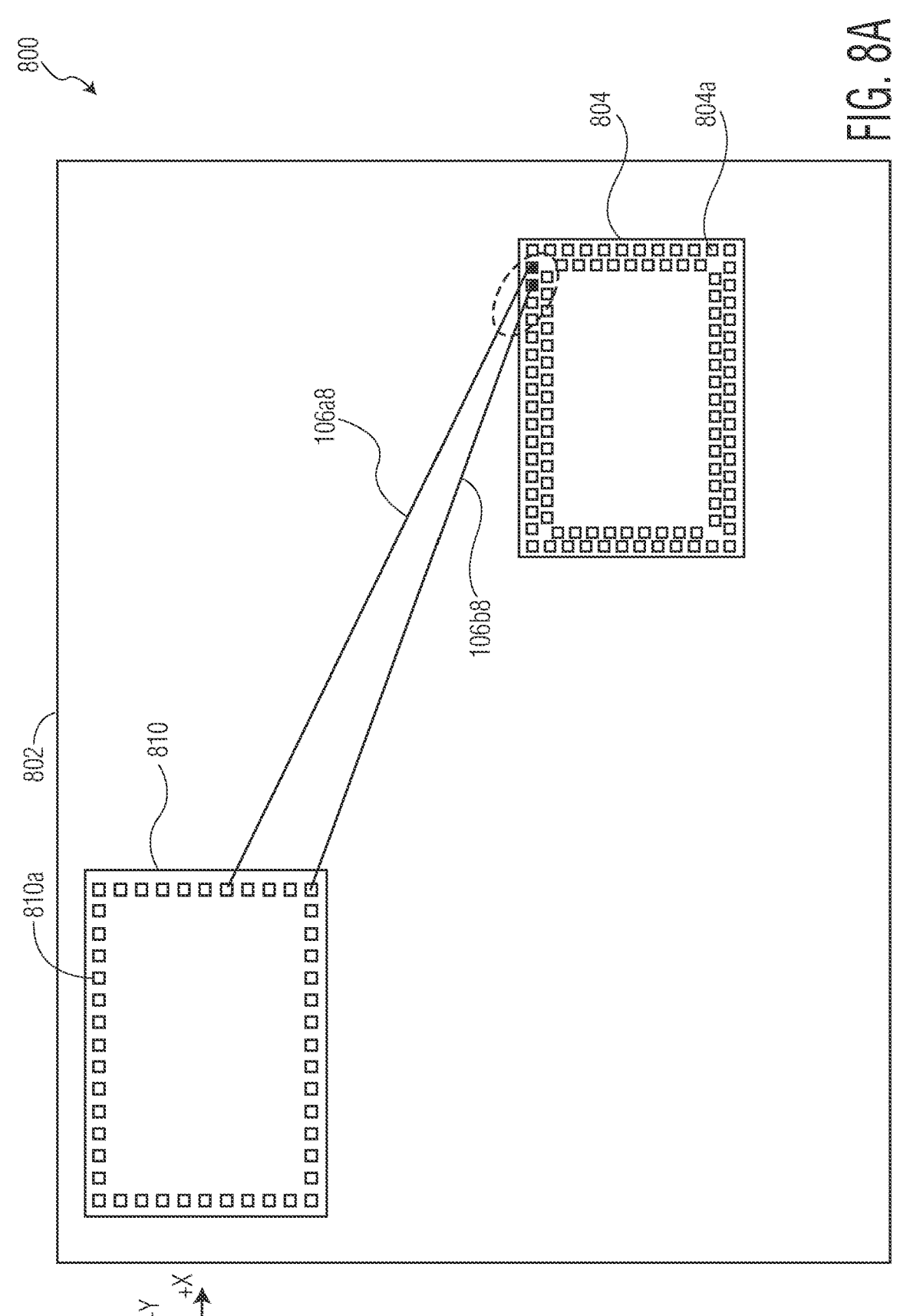
FIG. 8A is a top view block diagram illustrating simulation of placement of an electronic component in accordance with yet another exemplary embodiment of the invention.
Figure 8B:
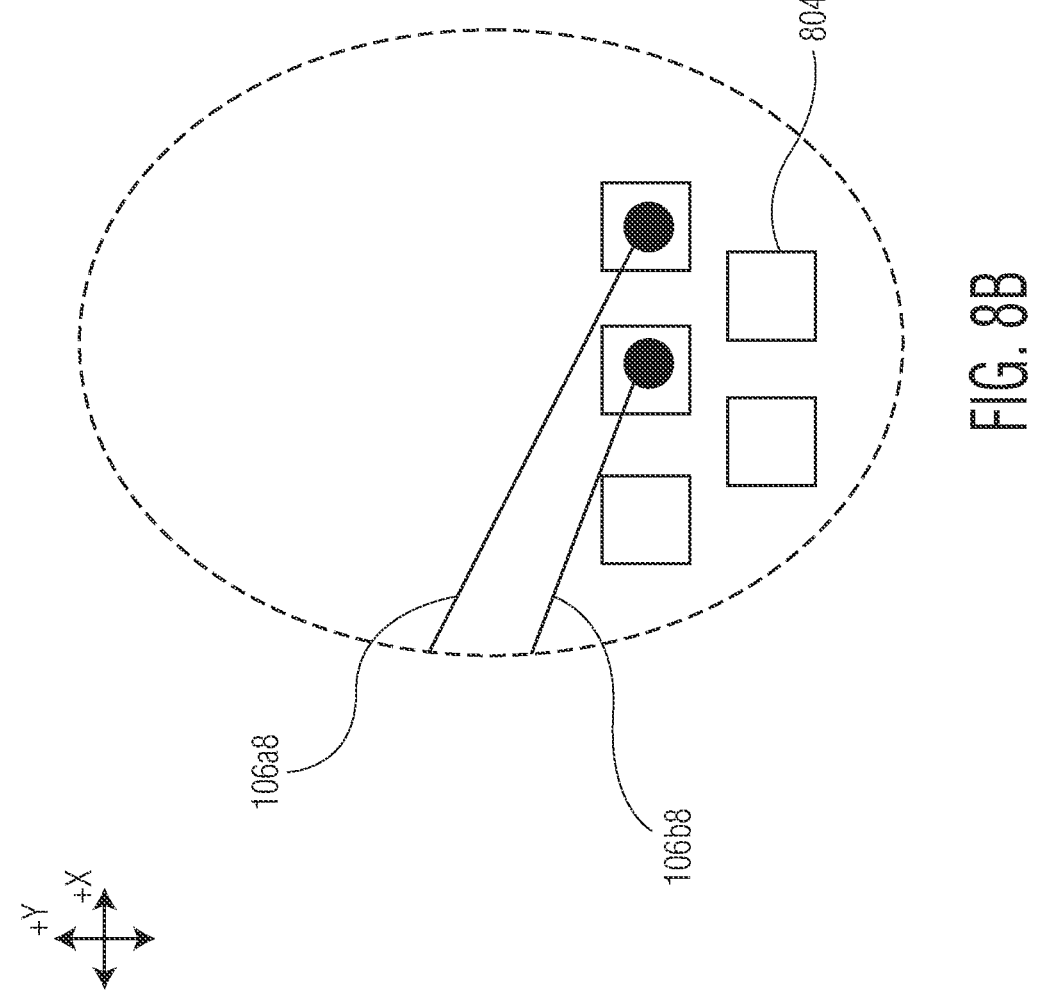
FIG. 8B is a detailed view of a portion of FIG. 8A.

Referring now to FIGS. 8A-8B, a semiconductor package 800 is illustrated. Semiconductor package 800 includes a substrate 802, an electronic component 804 (including a plurality of bonding locations 804a), and another electronic component 810 (including a plurality of bonding locations 810a). In this illustration, electronic component 804 (e.g., a die) and electronic component 810 (e.g., a die) are shown in a "design location" on substrate 802 (e.g., initial location planned according to package data of semiconductor package 800). Wire loop 106a8 and wire loop 106b8 are formed between electronic component 804 to electronic component 810 (e.g., die-to-die bonding).

Referring specifically to FIG. 8B, a detailed view of a portion of FIG. 8A is illustrated. In this detailed view, the proximity of wire loop 106a8 to wire loop 106b8 is more clearly illustrated. The relative positioning of wire loops 106a8 and 106b8 (i.e., the wire loops formed in a design placement of electronic component 804) is useful in explaining the relative movement of wire loop simulations in other figures.

Figure 9A:
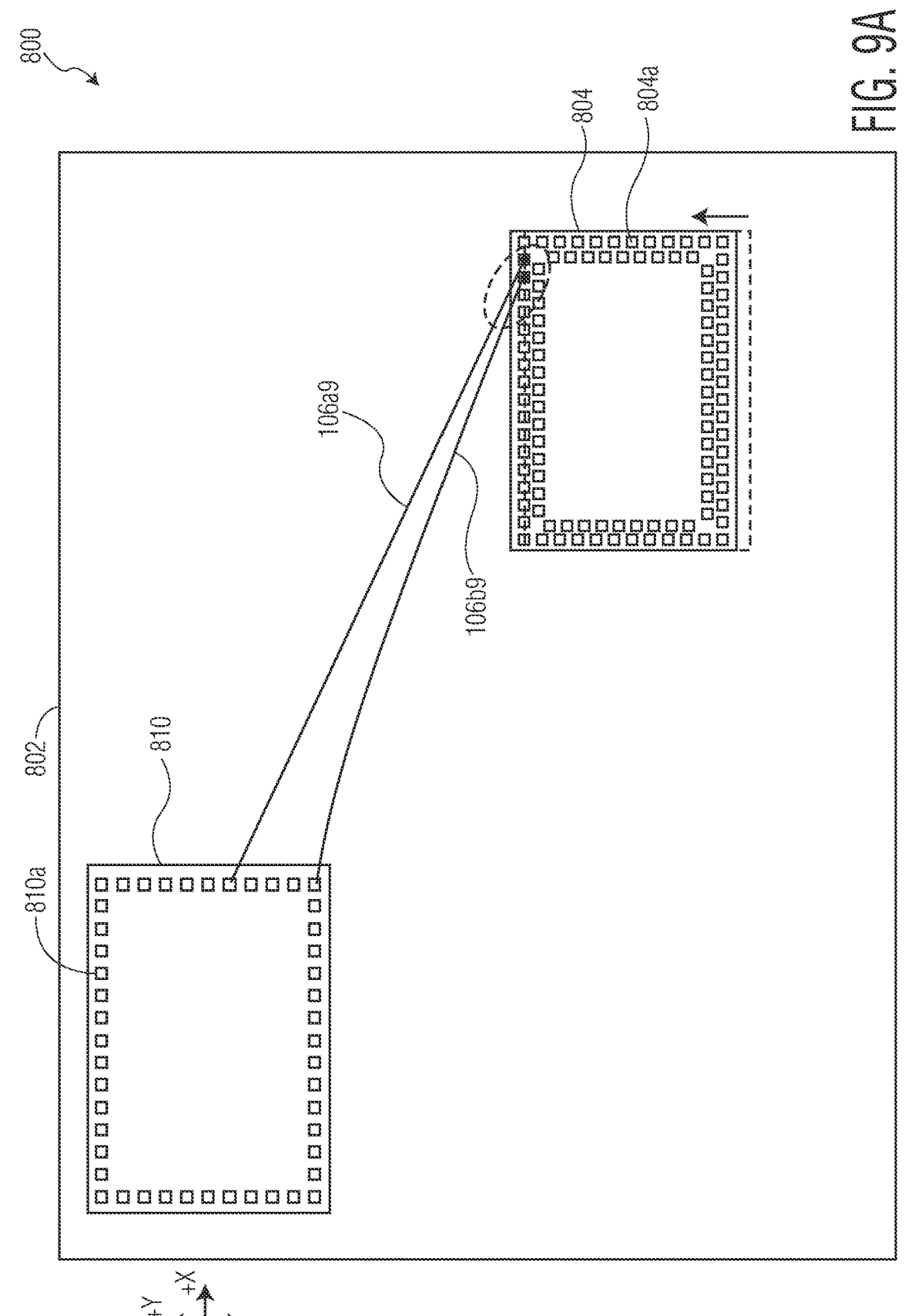
FIG. 9A is a top view block diagram illustrating the semiconductor package of FIG. 8A illustrating simulation of placement of an electronic component in a different position as compared to FIG. 8A, useful for explaining various exemplary embodiments of the invention.

Referring now to FIG. 9A, the placement of electronic component 804 is simulated upward (i.e., +Y direction) from a design placement (i.e., the placement of electronic component 804 in FIG. 8A) with respect to substrate 802 of semiconductor package 800. In other words, electronic component 804 has been "shifted" upward as compared to the placement of electronic component 804 in FIG. 8A (the dotted line box in FIG. 9A represents the position of electronic component 804 from FIG. 8A). Consequently, a wire loop 106b9 and a wire loop 106a9 are affected by the shift in placement. The effect of wire loops 106a9 and 106b9 is more clearly illustrated in FIG. 9B.

Figure 9B:
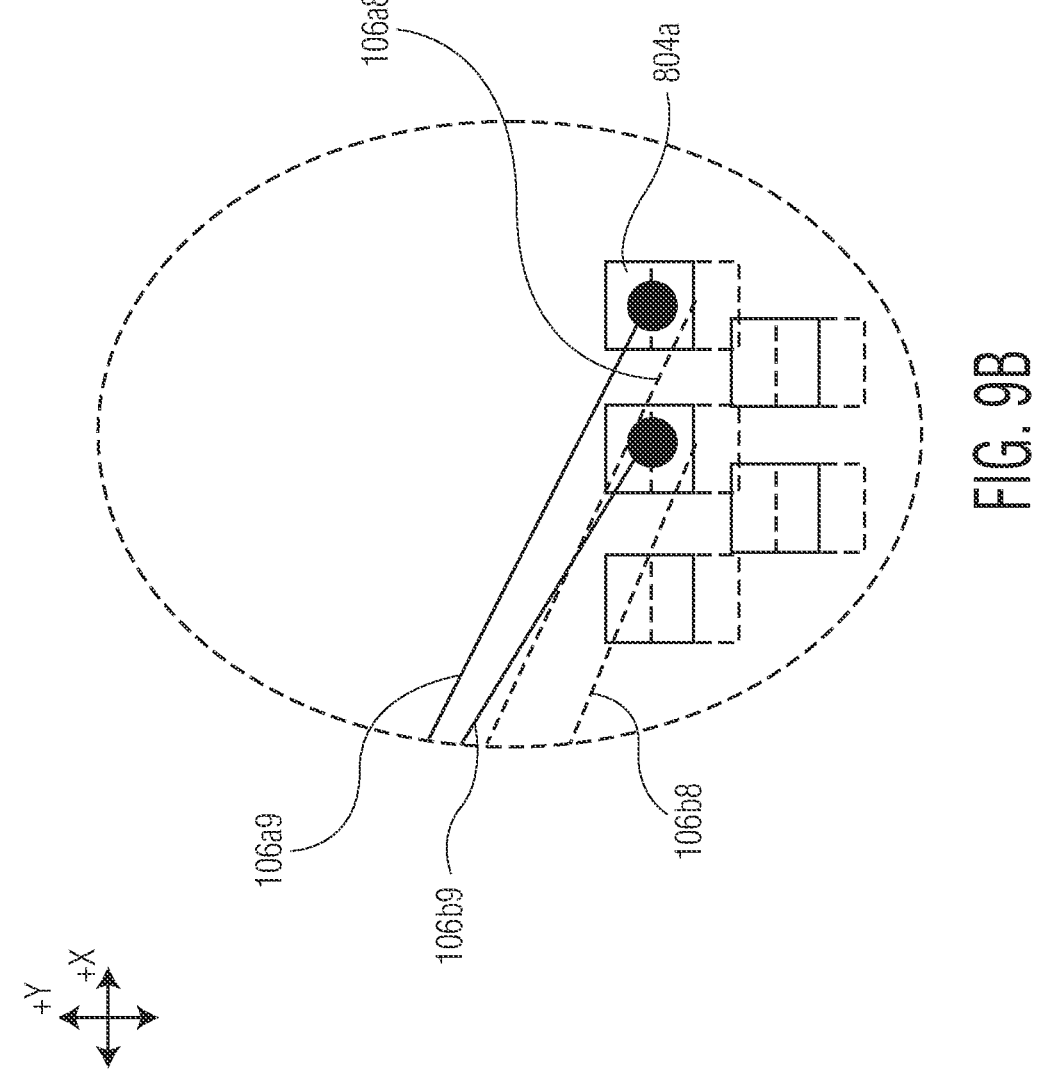
FIG. 9B is a detailed view of a portion of FIG. 9A.

In FIG. 9B, a detailed view of a portion of FIG. 9A is illustrated. In order to show the effect of the movement of electronic component 804 from FIG. 8A to FIG. 9A, FIG. 9B shows wire loops 106a8/106b8 in a dashed line form and bonding locations 804a in both a solid line form and a dashed line form. The solid line form of wire loops 106a9/106b9 shows their positions from FIG. 9A, and the dashed line form shows their positions (i.e., wire loops 106a8/106b8) from FIG. 8A. In this detailed view, the proximity of wire loop 106a9 to wire loop 106b9 is more clearly illustrated. As a result of the shifted placement of electronic component 804, wire loop 106b9 nearly interferes with wire loop 106a9. For example, in this simulation, the second bonds of wire loop 106a9 and wire loop 106b9 (i.e., the end of the wire bonded to electronic component 810) are located at the same positions as the second bonds of wire loop 106a8 and wire loop 106b8; consequently, when electronic component 804 is shifted upward (i.e., +Y direction), the orientation of the wire loop 106b9 changes with respect to the orientation of wire loop 106b8 (and/or substrate 802). Simultaneously, as a result of electronic component 804 shifting upward, the position and orientation of wire loop 106a9 changes, causing potential interference with wire loop 106b9. The extent of the effect on wire loops caused by this simulated placement (i.e., the relative shift upward) of electronic component (e.g., electronic component 804) can be determined using a software tool.

Figure 9C:
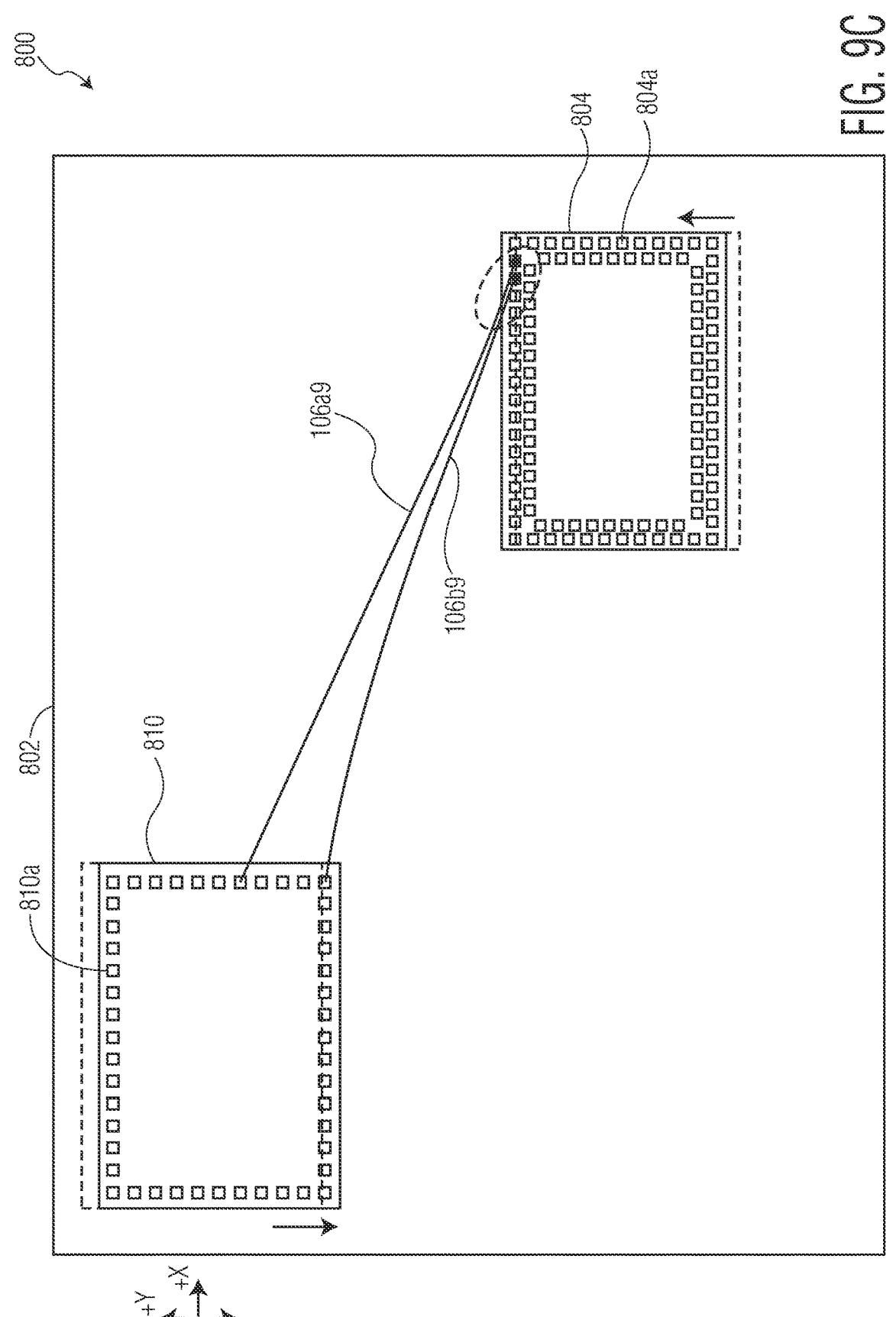
FIG. 9C is a top view block diagram illustrating simulation of placement of two electronic components in the semiconductor package of FIG. 8A in accordance with yet another exemplary embodiment of the invention.
Figure 9D:
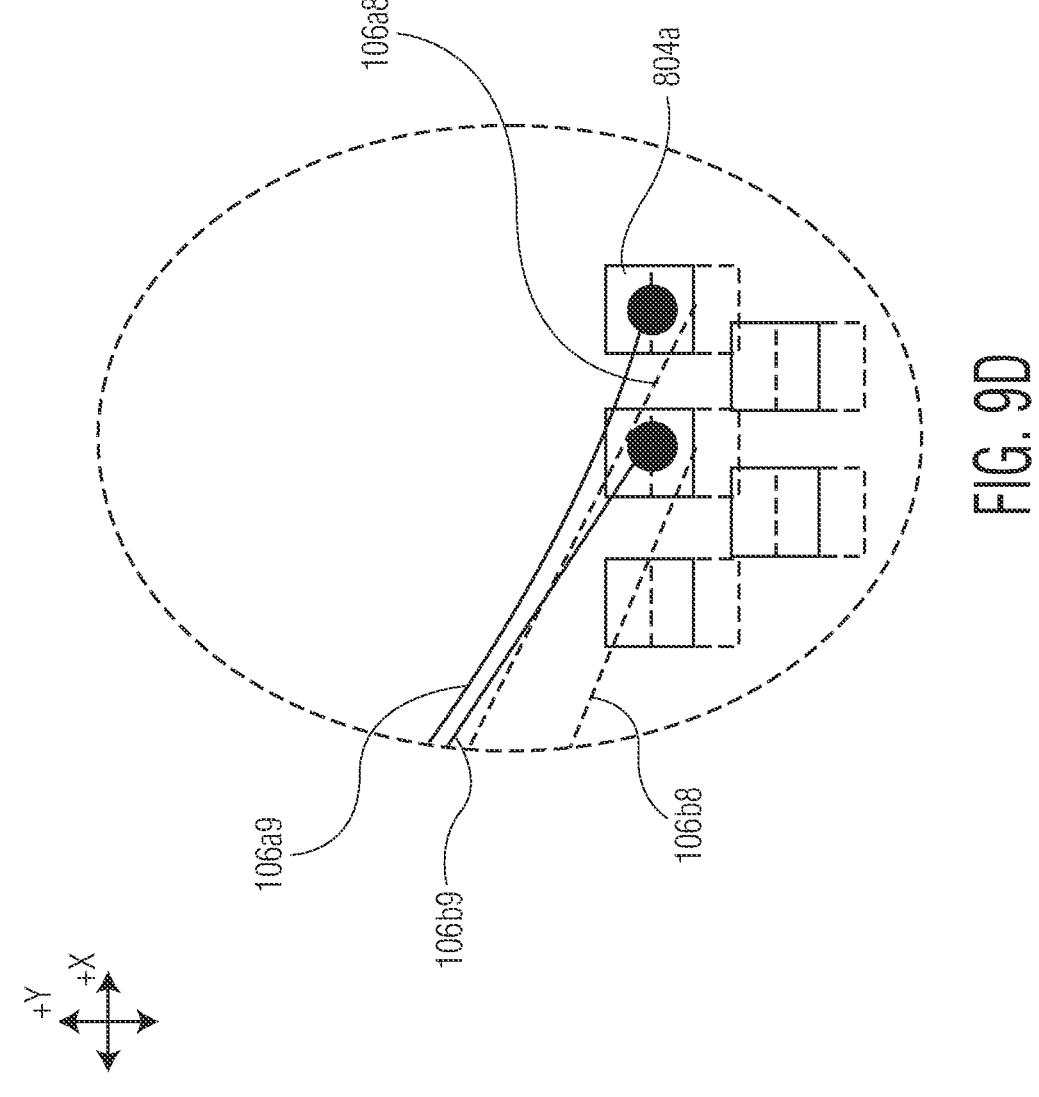
FIG. 9D is a detailed view of a portion of FIG. 9C.

Referring now to FIGS. 9C-9D: the placement of electronic component 804 is simulated upward (i.e., +Y direction) from a design placement (i.e., the placement of electronic component 804 in FIG. 8A) with respect to substrate 802 of semiconductor package 800; and the placement of electronic component 810 is simulated downward (i.e., −Y direction) from a design placement (i.e., the placement of electronic component 810 in FIG. 8A) with respect to substrate 802 of semiconductor package 800. In other words: electronic component 804 has been "shifted" upward as compared to the placement of electronic component 804 in FIG. 8A (the dotted line box in FIG. 9C represents the position of electronic component 804 from FIG. 8A); and electronic component 810 has been "shifted" downward as compared to the placement of electronic component 810 in FIG. 8A (the dotted line box in FIG. 9C represents the position of electronic component 804 from FIG. 8A). Consequently, a wire loop 106b9 and a wire loop 106a9 are affected by the shifts in placement. The effect on wire loops 106a9 and 106b9 is more clearly illustrated in FIG. 9D.

Referring specifically to FIG. 9D, as a result of the shifted placement of electronic component 804 and electronic component 810, wire loop 106b9 nearly interferes with wire loop 106a9 (e.g., to a greater degree than the placement illustrated in FIG. 9A-9B). The extent of the effect on the wire loops caused by this simulated placement of electronic component 804 and electronic component 810 can be determined using a software tool.

FIGS. 10-12 are flow diagrams illustrating methods in accordance with various exemplary embodiments of the invention. As is understood by those skilled in the art, certain steps included in the flow diagram may be omitted; certain additional steps may be added; and the order of the steps may be altered from the order illustrated—all within the scope of the invention.

Referring now to FIG. 10, a method of determining an effect of electronic component placement accuracy on wire loops in a semiconductor package is illustrated. At Step 1002, package data is provided for a semiconductor package, the semiconductor package including an electronic component. At Step 1004, placement of the electronic component is simulated in a plurality of positions with respect to a substrate in the semiconductor package (e.g., see simulated positions of electronic components in FIGS. 2A-2B, FIGS. 3A-3B, FIGS. 4A-4B, FIGS. 5A-5B, FIGS. 6A-6B, FIGS. 7A-7B, and FIGS. 9A-9D). At Step 1006 a software tool is used to determine an effect of each of the plurality of positions of the electronic component on wire loops included in the semiconductor package. At optional Step 1008, an acceptable variation in at least one of shift and rotation of the electronic component with respect to the substrate is determined using information determined in Step 1006. At optional Step 1010, an optimal position of the electronic component in at least one of shift and rotation with respect to the substrate is determined using information determined in Step 1006.

Referring now to FIG. 11, a method of determining an acceptable level of variation in the placement of an electronic component in connection with a semiconductor package is illustrated. At Step 1102, package data is provided for a semiconductor package, the semiconductor package including an electronic component. At Step 1104, placement of the electronic component is simulated in a plurality of positions with respect to a substrate of the semiconductor package (e.g., see simulated positions of electronic components in FIGS. 2A-2B, FIGS. 3A-3B, FIGS. 4A-4B, FIGS. 5A-5B, FIGS. 6A-6B, FIGS. 7A-7B, and FIGS. 9A-9D). At Step 1106, an acceptable level of variation in at least one of shift and rotation of the electronic component with respect to the substrate is determined.

Referring now to FIG. 12, a method of determining an optimal position for placement of an electronic component in a semiconductor package is illustrated. At Step 1202, package data is provided for a semiconductor package, the semiconductor package including an electronic component. At Step 1204, placement of the electronic component is simulated in a plurality of positions with respect to a substrate of the semiconductor package (e.g., see simulated positions of electronic components in FIGS. 2A-2B, FIGS. 3A-3B, FIGS. 4A-4B, FIGS. 5A-5B, FIGS. 6A-6B, FIGS. 7A-7B, and FIGS. 9A-9D). At Step 1206, an optimal position of the electronic component in at least one of shift and rotation is determined with respect to the semiconductor package.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining an effect of electronic component placement accuracy on wire loops in a semiconductor package, the method comprising the steps of:
(a) providing package data for a semiconductor package, the semiconductor package including an electronic component;
(b) simulating placement of the electronic component in a plurality of positions with respect to a substrate in the semiconductor package; and
(c) determining, using a software tool, an effect of each of the plurality of positions of the electronic component on a plurality of wire loops included in the semiconductor package.

2. The method of claim 1 wherein the package data provided includes at least one of (i) computer aided design data related to the semiconductor package and (ii) package data derived using an online teaching reference system of a wire bonding machine.

3. The method of claim 1 wherein the package data provided includes at least one of a two-dimensional wire layout of the semiconductor package, a three-dimensional wire layout of the semiconductor package, an electronic component height, bonding locations of the electronic component, bonding locations of the substrate, relative distances between first bonding locations and second bonding locations, a wire diameter, and a wire type.

4. The method of claim 1 wherein the electronic component is configured to be placed on the substrate of the semiconductor package, and wherein the plurality of positions of the electronic component include positions where the electronic component is shifted along at least one of an x-axis and a y-axis with respect to the substrate.

5. The method of claim 1 wherein the electronic component is configured to be placed on a substrate of the semiconductor package, and wherein the plurality of positions of the electronic component include positions where the electronic component is rotated with respect to the substrate.

6. The method of claim 1 wherein the electronic component is configured to be placed on the substrate in the semiconductor package, and wherein the plurality of positions of the electronic component include (i) positions where the electronic component is shifted along at least one of an x-axis and a y-axis with respect to the substrate, and (ii) positions where the electronic component is rotated with respect to the substrate.

7. The method of claim 1 wherein step (c) includes determining the effect of each of the plurality of positions of the electronic component on short circuiting of one or more wire loops included in the semiconductor package.

8. The method of claim 1 wherein step (c) includes determining the effect of each of the plurality of positions of the electronic component on clearance between a wire loop included in the semiconductor package and other structures in the semiconductor package.

9. The method of claim 8 wherein the other structures include at least one of neighboring wire loops and other electronic components.

10. The method of claim 1 further comprising a step of determining an acceptable variation in at least one of shift and rotation of the electronic component with respect to the substrate using information determined in step (c).

11. The method of claim 1 further comprising a step of determining an optimal position of the electronic component in at least one of shift and rotation with respect to the substrate using information determined in step (c).

12. The method of claim 1 wherein the electronic component is a semiconductor die.

13. The method of claim 1 wherein at least one of the plurality of wire loops is configured to be bonded to the electronic component.

14. The method of claim 1 wherein the plurality of wire loops are not configured to be bonded to the electronic component.

* * * * *